(12) United States Patent
Kamiyama

(10) Patent No.: US 12,259,745 B2
(45) Date of Patent: Mar. 25, 2025

(54) REAL-TIME CLOCK MODULE

(71) Applicant: SEIKO EPSON CORPORATION, Tokyo (JP)

(72) Inventor: Masayuki Kamiyama, Chino (JP)

(73) Assignee: SEIKO EPSON CORPORATION (JP)

( * ) Notice: Subject to any disclaimer, the term of this patent is extended or adjusted under 35 U.S.C. 154(b) by 63 days.

(21) Appl. No.: 18/188,582

(22) Filed: Mar. 23, 2023

(65) Prior Publication Data

US 2023/0305591 A1 Sep. 28, 2023

(30) Foreign Application Priority Data

Mar. 24, 2022 (JP) ................. 2022-047982

(51) Int. Cl.
| | | |
|---|---|---|
| *G06F 1/04* | (2006.01) | |
| *G06F 1/06* | (2006.01) | |
| *G06F 1/14* | (2006.01) | |
| *H03L 7/099* | (2006.01) | |
| *G06F 1/08* | (2006.01) | |

(52) U.S. Cl.
CPC .................. *G06F 1/06* (2013.01); *G06F 1/14* (2013.01); *H03L 7/0991* (2013.01); *G06F 1/08* (2013.01)

(58) Field of Classification Search
CPC ..... G06F 1/06; G06F 1/14; G06F 1/08; G06F 1/263; H03L 7/0991
USPC ........................................................ 713/501
See application file for complete search history.

(56) References Cited

U.S. PATENT DOCUMENTS

| | | | | |
|---|---|---|---|---|
| 3,973,110 A | * | 8/1976 | Rode ...................... | G04G 9/087 368/251 |
| 5,262,758 A | * | 11/1993 | Nam ..................... | G08B 21/182 374/E1.002 |
| 5,559,762 A | * | 9/1996 | Sakamoto ................ | G04G 5/00 368/251 |
| 5,771,373 A | * | 6/1998 | Kau ...................... | G06F 1/3203 713/500 |
| 9,616,814 B1 | * | 4/2017 | Chiang .................. | B60Q 9/008 |
| 2003/0085739 A1 | * | 5/2003 | Totsuka .................. | H03L 7/087 327/40 |
| 2004/0246032 A1 | * | 12/2004 | Ogiso .................. | H03K 3/0307 327/141 |
| 2010/0277314 A1 | * | 11/2010 | Bradley .................. | G07C 1/10 340/540 |
| 2015/0277388 A1 | * | 10/2015 | Almudafier ............ | G04G 15/00 368/11 |
| 2017/0032125 A1 | * | 2/2017 | Lee ........................ | G08B 21/18 |
| 2017/0221340 A1 | * | 8/2017 | Rhoads, Jr. .......... | G04G 13/021 |

FOREIGN PATENT DOCUMENTS

JP      2011-113173 A      6/2011

* cited by examiner

*Primary Examiner* — Volvick Derose
(74) *Attorney, Agent, or Firm* — Harness, Dickey & Pierce, P.L.C.

(57) ABSTRACT

A real-time clock module includes: an oscillation circuit configured to generate a first clock signal by oscillating a resonator; an interface circuit configured to receive alarm setting data; a memory in which the alarm setting data and a program are to be stored; and a processor configured to execute the program to perform a comparison process of comparing clocking data generated based on the first clock signal with the alarm setting data, and output an alarm signal according to a result of the comparison process.

5 Claims, 16 Drawing Sheets

FIG. 3

STORAGE AREA A (16bit × 4)

| bit15 | bit14 | bit13 | bit12 | bit11 | bit10 | bit9 | bit8 | bit7 | bit6 | bit5 | bit4 | bit3 | bit2 | bit1 | bit0 | |
|---|---|---|---|---|---|---|---|---|---|---|---|---|---|---|---|---|
| - | - | - | - | - | - | - | - | - | SEC_H[2:0] | | | SEC_L[3:0] | | | | ⎫ |
| - | - | HOUR_H[1:0] | | HOUR_L[3:0] | | | | - | MIN_H[2:0] | | | MIN_L[3:0] | | | | ⎬ BCD CLOCKING DATA |
| - | - | - | WEEK[2:0] | | | MONTH_H[0] | MONTH_L[3:0] | | | | - | DAY_H[1:0] | | DAY_L[3:0] | | ⎪ |
| YEAR2_H[3:0] | | | | YEAR2_L[3:0] | | | | YEAR1_H[3:0] | | | | YEAR1_L[3:0] | | | | ⎭ |

STORAGE AREA B (16bit × 4)

| bit15 | bit14 | bit13 | bit12 | bit11 | bit10 | bit9 | bit8 | bit7 | bit6 | bit5 | bit4 | bit3 | bit2 | bit1 | bit0 | |
|---|---|---|---|---|---|---|---|---|---|---|---|---|---|---|---|---|
| - | - | - | - | - | - | - | - | - | SEC_H[2:0] | | | SEC_L[3:0] | | | | ⎫ |
| - | - | HOUR_H[1:0] | | HOUR_L[3:0] | | | | - | MIN_H[2:0] | | | MIN_L[3:0] | | | | ⎬ BCD CLOCKING DATA |
| - | - | - | WEEK[2:0] | | | MONTH_H[0] | MONTH_L[3:0] | | | | - | DAY_H[1:0] | | DAY_L[3:0] | | ⎪ |
| YEAR2_H[3:0] | | | | YEAR2_L[3:0] | | | | YEAR1_H[3:0] | | | | YEAR1_L[3:0] | | | | ⎭ |

STORAGE AREA C (16bit × 3)

| bit15 | bit14 | bit13 | bit12 | bit11 | bit10 | bit9 | bit8 | bit7 | bit6 | bit5 | bit4 | bit3 | bit2 | bit1 | bit0 | |
|---|---|---|---|---|---|---|---|---|---|---|---|---|---|---|---|---|
| - | - | - | - | - | - | - | - | SEC_BIN[7:0] | | | | | | | | ⎫ |
| SEC_BIN[23:8] | | | | | | | | | | | | | | | | ⎬ BINARY CLOCKING DATA |
| - | - | - | - | - | - | - | - | SEC_BIN[32:24] | | | | | | | | ⎭ |

STORAGE AREA D (16bit × 3)

| bit15 | bit14 | bit13 | bit12 | bit11 | bit10 | bit9 | bit8 | bit7 | bit6 | bit5 | bit4 | bit3 | bit2 | bit1 | bit0 | |
|---|---|---|---|---|---|---|---|---|---|---|---|---|---|---|---|---|
| - | - | - | - | - | - | - | - | SEC_BIN[7:0] | | | | | | | | ⎫ |
| SEC_BIN[23:8] | | | | | | | | | | | | | | | | ⎬ BINARY CLOCKING DATA |
| - | - | - | - | - | - | - | - | SEC_BIN[32:24] | | | | | | | | ⎭ |

FIG. 4
STORAGE AREA E (16bit × 4) — BCD ALARM FIRST SETTING DATA
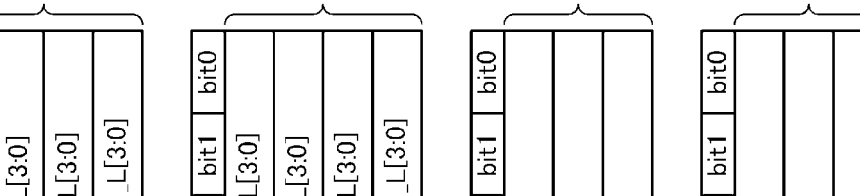
STORAGE AREA F (16bit × 4) — BCD ALARM SECOND SETTING DATA
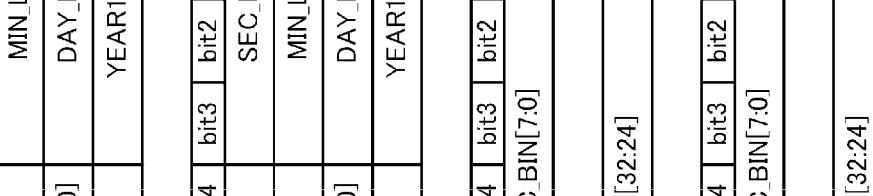
STORAGE AREA G (16bit × 3) — BINARY ALARM FIRST SETTING DATA
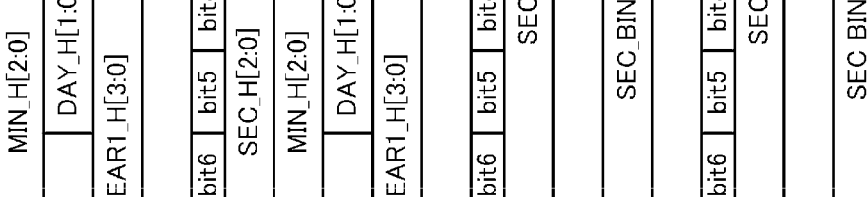
STORAGE AREA H (16bit × 3) — BINARY ALARM SECOND SETTING DATA

FIG 5

INTERNAL FLAG REGISTER

| bit7 | bit6 | bit5 | bit4 | bit3 | bit2 | bit1 | bit0 |
|------|------|------|------|------|------|------|------|
| -    | -    | FBUF2 | FBUF1 | FAlm4 | FAlm3 | FAlm2 | FAlm1 |

EXTERNAL FLAG REGISTER

| bit7 | bit6 | bit5 | bit4 | bit3 | bit2 | bit1 | bit0 |
|------|------|------|------|------|------|------|------|
| -    | -    | FE2  | FE1  | FA4  | FA3  | FA2  | FA1  |

FIRST ALARM SELECTION REGISTER

| bit7 | bit6 | bit5 | bit4 | bit3 | bit2 | bit1 | bit0 |
|------|------|------|------|------|------|------|------|
| -    | XYAE | XMOAE | XWAE | XDAE | XHAE | XMIAE | XSAE |

SECOND ALARM SELECTION REGISTER

| bit7 | bit6 | bit5 | bit4 | bit3 | bit2 | bit1 | bit0 |
|------|------|------|------|------|------|------|------|
| -    | XYAE | XMOAE | XWAE | XDAE | XHAE | XMIAE | XSAE |

CONTROL REGISTER

| bit7 | bit6 | bit5 | bit4 | bit3 | bit2 | bit1 | bit0 |
|------|------|------|------|------|------|------|------|
| -    | -    | AE4  | AE3  | AE2  | AE1  | BINCE | BCDCE |

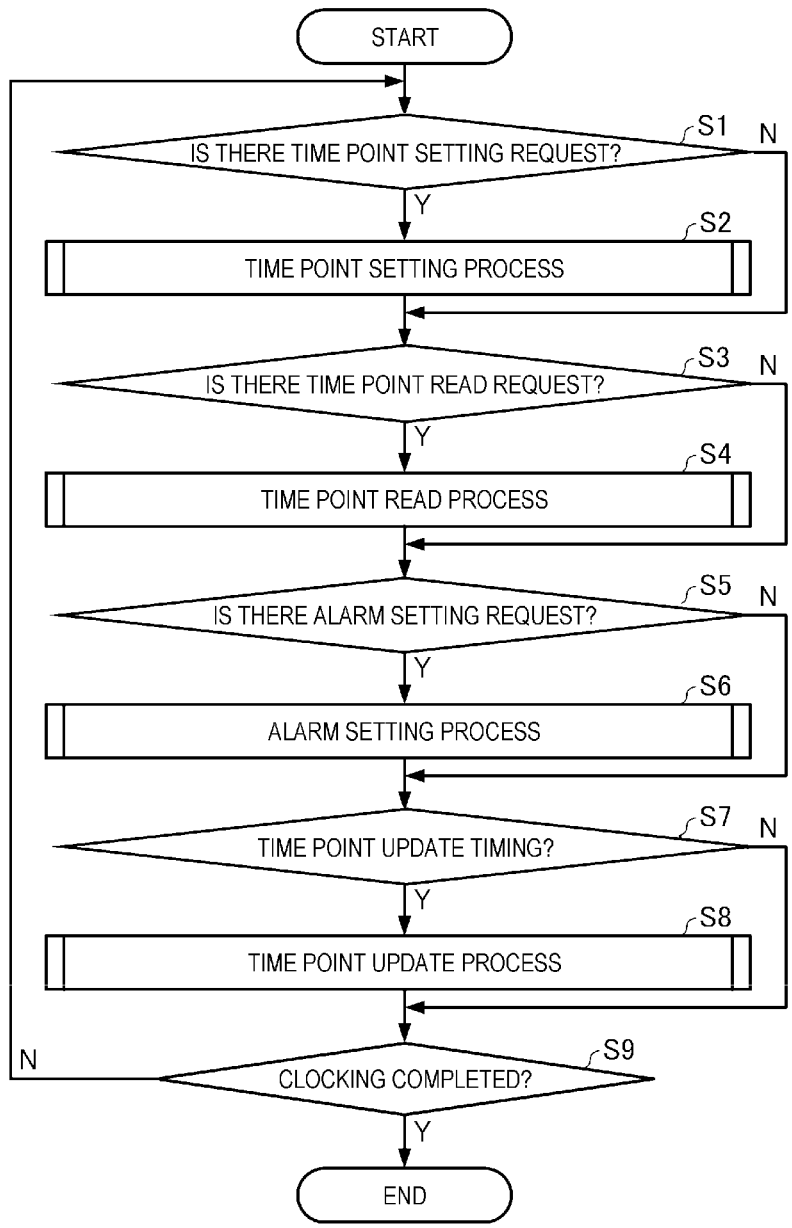

REAL-TIME CLOCK MODULE

The present application is based on, and claims priority from JP Application Serial Number 2022-047982, filed Mar. 24, 2022, the disclosure of which is hereby incorporated by reference herein in its entirety.

BACKGROUND

1. Technical Field

The present disclosure relates to a real-time clock module.

2. Related Art

JP-A-2011-113173 discloses a real-time clock device that includes a carry control unit that generates a carry signal based on a reference clock signal and an external access signal, a clocking unit that performs a clocking process based on the carry signal to generate clocking information, and an interrupt output control unit that generates and outputs an interrupt signal that is not affected by a state of the external access signal based on the reference clock signal, thereby accurately generating an interrupt signal in time.

However, in the real-time clock device disclosed in JP-A-2011-113173, an alarm unit included in the interrupt output control unit generates an interrupt signal by performing down-counting from an alarm calculation value obtained by calculating a difference between a preset alarm time point and the clocking information acquired from the clock unit. In general, since the alarm unit is implemented by a hardware logic circuit, the number of alarm channels, a setting of time point digits, and the like are fixed, and there is no extensibility of an alarm function. When a logic circuit capable of coping with various alarm functions is provided to increase the extensibility of the alarm function, a circuit scale of the real-time clock device is greatly increased.

SUMMARY

A real-time clock module according to one aspect of the present disclosure includes: an oscillation circuit configured to generate a first clock signal by oscillating a resonator; an interface circuit configured to receive alarm setting data; a memory in which the alarm setting data and a program are to be stored; and a processor configured to execute the program to perform a comparison process of comparing clocking data generated based on the first clock signal with the alarm setting data, and output an alarm signal according to a result of the comparison process.

BRIEF DESCRIPTION OF THE DRAWINGS

FIG. 3 is a diagram showing an example of bit allocation of the various types of data stored in a RAM.

FIG. 4 is a diagram showing an example of the bit allocation of the various types of data stored in the RAM.

FIG. 5 is a diagram showing an example of bit allocation of data stored in various registers.

FIG. 6 is a flowchart showing an example of a procedure of a process executed by the real-time clock module.

DESCRIPTION OF EXEMPLARY EMBODIMENTS

Hereinafter, a preferred embodiment of the present disclosure will be described in detail with reference to the drawings. The embodiment described below does not unduly limit the scope of the claims. Not all configurations described below are necessarily essential components of the present disclosure.

1. Real-time Clock Module

1-1. Configuration of Real-time Clock Module

Figure 1:
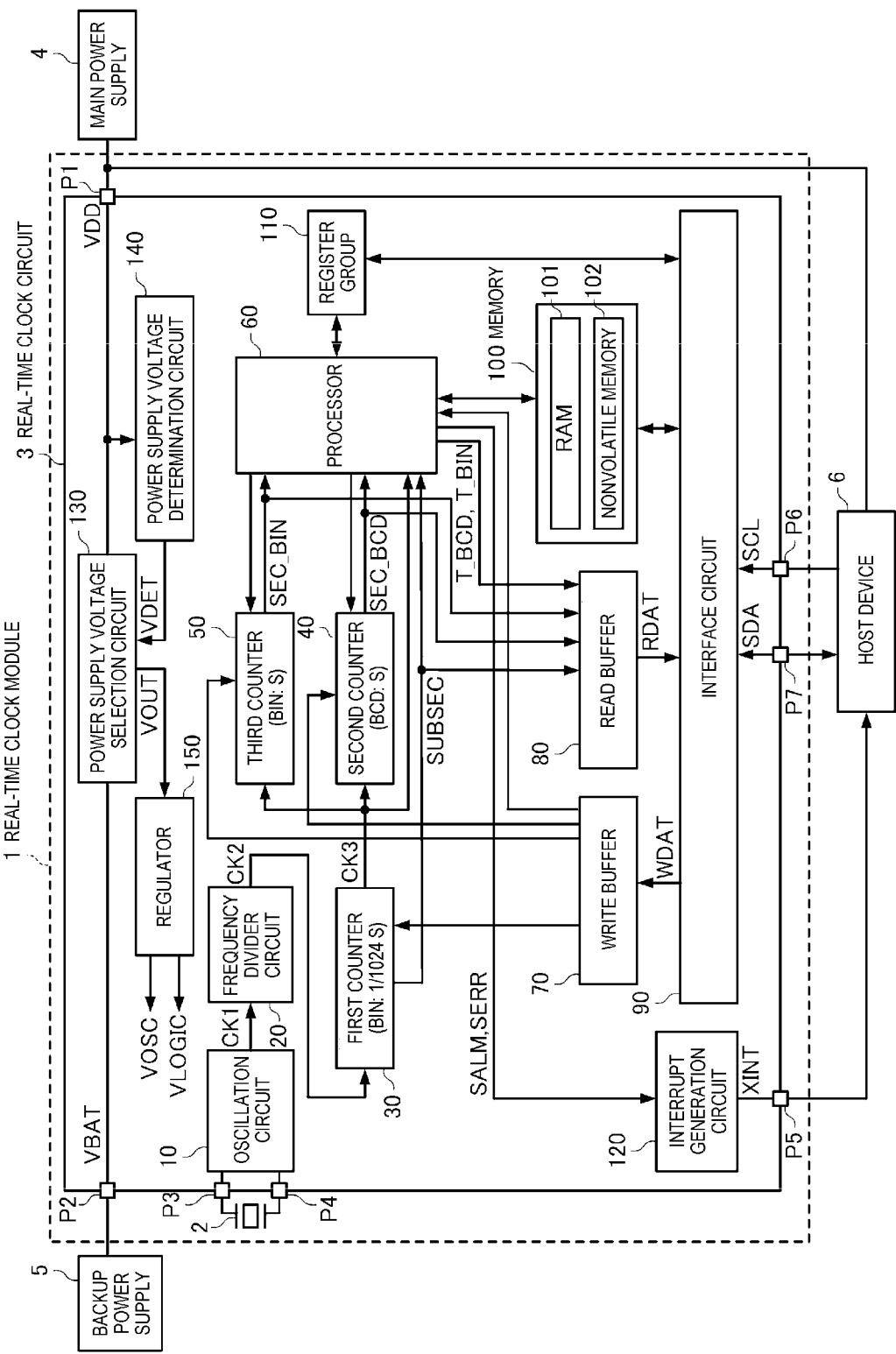
FIG. 1 is a functional block diagram of a real-time clock module according to an embodiment.

FIG. 1 is a functional block diagram of a real-time clock module 1 according to an embodiment. As shown in FIG. 1, the real-time clock module 1 includes a resonator 2 and a real-time clock circuit 3.

The real-time clock module 1 is supplied with a power supply voltage VDD from a main power supply 4 via a terminal P1 of the real-time clock circuit 3, and is supplied with a power supply voltage VBAT from a backup power supply 5 via a terminal P2 of the real-time clock circuit 3.

The resonator 2 may be a tuning fork type quartz crystal resonator, an AT cut quartz crystal resonator, an SC cut quartz crystal resonator, or the like, or may be a piezoelectric resonator other than a SAW resonator or a quartz crystal resonator. The SAW is an abbreviation for surface acoustic wave. The resonator 2 may be a MEMS resonator made of a silicon semiconductor. The MEMS is an abbreviation for micro electro mechanical systems. The resonator 2 may be excited by a piezoelectric effect or may be driven by a Coulomb force.

The real-time clock circuit 3 includes an oscillation circuit 10, a frequency divider circuit 20, a first counter 30, a second counter 40, a third counter 50, a processor 60, a write buffer 70, a read buffer 80, an interface circuit 90, a memory 100, a register group 110, an interrupt generation circuit 120, a power supply voltage selection circuit 130, a power supply voltage determination circuit 140, and a regulator 150. However, the real-time clock circuit 3 may have a configuration in which a part of the elements are omitted or changed, or other elements are added. In the embodiment, the real-time clock circuit 3 is a one-chip integrated circuit. The real-time clock circuit 3 may be implanted by a multiple-chip integrated circuit, or at least a part thereof may be implemented by discrete components.

The power supply voltage determination circuit 140 monitors the power supply voltage VDD, determines whether the power supply voltage VDD is equal to or higher than a predetermined voltage value VT, and outputs a determination signal VDET. In the embodiment, the power supply voltage determination circuit 140 outputs a high level determination signal VDET when it is determined that the power supply voltage VDD is equal to or higher than the voltage value VT, and outputs a low level determination signal VDET when it is determined that the power supply voltage VDD is lower than the voltage value VT.

The power supply voltage selection circuit 130 selects the power supply voltage VDD or the power supply voltage VBAT based on the determination signal VDET, and outputs the selected power supply voltage as a power supply voltage VOUT. Specifically, when the determination signal VDET is at a high level, that is, when the power supply voltage determination circuit 140 determines that the power supply voltage VDD is equal to or higher than the voltage value VT, the power supply voltage selection circuit 130 selects the power supply voltage VDD. When the determination signal VDET is at a low level, that is, when the power supply voltage determination circuit 140 determines that the power supply voltage VDD is lower than the voltage value VT, the power supply voltage selection circuit 130 selects the power supply voltage VBAT.

Therefore, when the power supply voltage VDD is supplied from the main power supply 4 to the real-time clock module 1, the power supply voltage VOUT is the power supply voltage VDD and has a predetermined voltage value equal to or higher than VT. When a supply of the power supply voltage VDD from the main power supply 4 to the real-time clock module 1 is cut off, the power supply voltage VOUT is immediately switched to the power supply voltage VBAT and becomes a predetermined voltage value equal to or lower than VT. Therefore, the real-time clock module 1 can continue a clocking operation even while the supply of the power supply voltage VDD from the main power supply 4 is cut off. On the other hand, a host device 6 that controls an operation of the real-time clock module 1 operates by being supplied with the power supply voltage VDD from the main power supply 4, and stops the operation when the supply of the power supply voltage VDD from the main power supply 4 is cut off.

The regulator 150 generates, based on the power supply voltage VOUT, a power supply voltage VOSC and a power supply voltage VLOGIC stabilized at a constant voltage value.

The power supply voltage VOSC is supplied to the oscillation circuit 10. The power supply voltage VLOGIC is supplied to the frequency divider circuit 20, the first counter 30, the second counter 40, the third counter 50, the processor 60, the write buffer 70, the read buffer 80, the interface circuit 90, the memory 100, the register group 110, and the interrupt generation circuit 120.

The oscillation circuit 10 oscillates the resonator 2 to generate a first clock signal CK1. Specifically, the oscillation circuit 10 is electrically coupled to both ends of the resonator 2 via terminals P3 and P4 of the real-time clock circuit 3, and amplifies and feeds back an output signal of the resonator 2 to oscillate the resonator 2 to output the first clock signal CK1. In the embodiment, a frequency of the first clock signal CK1 is 32.768 kHz. However, the frequency of the first clock signal CK1 is not particularly limited. In order to make the frequency of the first clock signal CK1 accurate, the oscillation circuit 10 is preferably an oscillation circuit having a temperature compensation function and a frequency control function.

The frequency divider circuit 20 divides the frequency of the first clock signal CK1 to generate a second clock signal CK2 having a desired frequency. In the embodiment, a frequency division ratio of the frequency divider circuit 20 is 32, and a frequency of the second clock signal CK2 is 1.024 kHz. However, the frequency division ratio of the frequency divider circuit 20 and the frequency of the second clock signal CK2 are not particularly limited.

The first counter 30 counts the number of pulses of the second clock signal CK2 based on the first clock signal CK1, and outputs a third clock signal CK3 based on a count value. Specifically, the first counter 30 divides the frequency of the second clock signal CK2 by 1024 to generate the third clock signal CK3 of 1 Hz, and performs a count operation in synchronization with the second clock signal CK2. The first counter 30 is a 10-bit binary counter, and sequentially generates binary count values representing 0 to 1023 in decimal number. When the count value is equal to a value representing 1023 in decimal number, the first counter 30 resets the count value to 0 in synchronization with the next pulse of the second clock signal CK2. The count value generated by the first counter 30 is used as clocking data SUBSEC representing a time point in units of $1/1024$ seconds.

The second counter 40 is a second counter, and performs a count operation in synchronization with the third clock signal CK3 to generate time point data representing a time point in units of seconds. The second counter 40 is a 7-bit sexagesimal BCD counter, and sequentially generates a BCD count value representing 0 to 59 in decimal number in synchronization with a pulse of the third clock signal CK3. The BCD is an abbreviation for binary coded decimal. When the count value is equal to a value representing 59 in decimal number, the second counter 40 resets the count value to 0 in synchronization with the next pulse of the third clock signal CK3. The count value generated by the second counter 40 is used as clocking data SEC_BCD representing a time point in units of seconds.

The third counter 50 is a second counter, and performs a count operation in synchronization with the third clock signal CK3 to generate a count value indicating a time point in units of seconds. The third counter 50 is an 8-bit binary counter, and sequentially generates binary count values representing 0 to 255 in decimal number in synchronization with the pulse of the third clock signal CK3. When the count value is equal to a value representing 255 in decimal number, the third counter 50 resets the count value to 0 in synchronization with the next pulse of the third clock signal CK3. The count value generated by the third counter 50 is used as clocking data SEC_BIN representing a time point in units of seconds.

Figure 2:
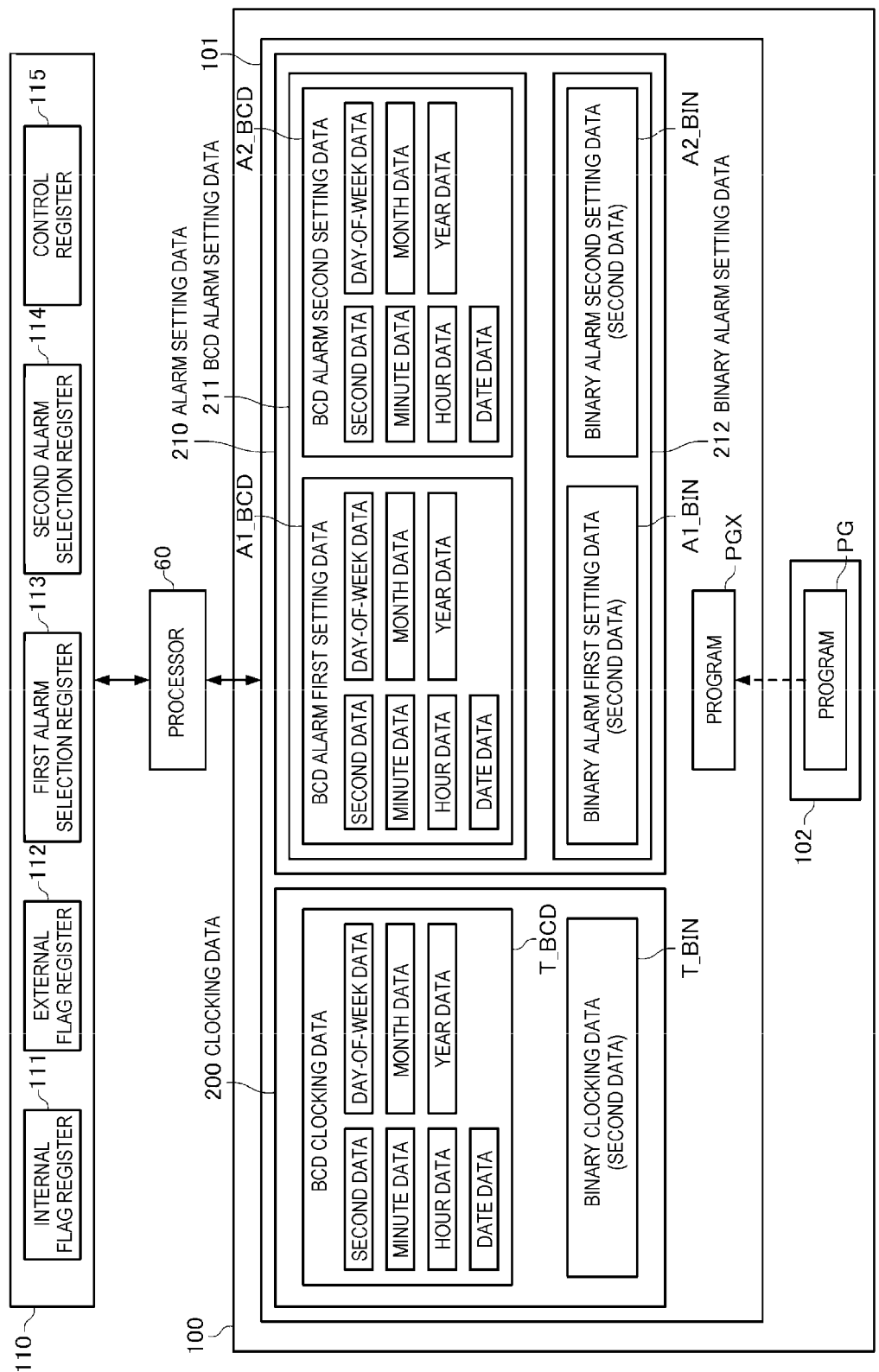
FIG. 2 is a diagram showing an example of a program, various types of data, and various registers.

The memory 100 is a circuit that stores programs and various types of data. In the embodiment, the memory 100 includes a RAM 101 and a nonvolatile memory 102. The register group 110 includes various registers. The RAM is an abbreviation of random access memory. FIG. 2 is a diagram showing an example of the programs and the various types of data stored in the memory 100 and the various registers included in the register group 110.

As shown in FIG. 2, the RAM 101 stores clocking data 200 and alarm setting data 210. The clocking data 200 is at least one piece of BCD clocking data T_BCD, which is BCD-format clocking data, and binary clocking data T_BIN, which is binary-format clocking data. The alarm setting data 210 is at least one piece of BCD alarm setting data 211, which is BCD-format setting data, and binary alarm setting data 212, which is binary-format setting data. The BCD alarm setting data 211 includes a plurality of pieces of setting data corresponding to a plurality of time points. Specifically, the BCD alarm setting data 211 includes two pieces of setting data corresponding to two time points, that is, BCD alarm first setting data A1_BCD and BCD alarm second setting data A2_BCD. Similarly, the binary alarm setting data 212 includes a plurality of pieces of setting data corresponding to a plurality of time points. Specifically, the binary alarm setting data 212 includes two pieces of setting data corresponding to two time points, that is, binary alarm first setting data A1_BIN and binary alarm second setting data A2_BIN.

The BCD clocking data T_BCD, the BCD alarm first setting data A1_BCD, and the BCD alarm second setting data A2_BCD each include second data representing 0 to 59, minute data representing 0 to 59, hour data representing 0 to 23, date data representing 1 to 31, day-of-week data representing 1 to 7, month data representing 1 to 12, and year data representing 0 to 9999. The binary clocking data T_BIN, the binary alarm first setting data A1_BIN, and the binary alarm second setting data A2_BIN each include second data.

FIGS. 3 and 4 are diagrams showing examples of bit allocation of various types of data stored in the RAM 101. In the examples of FIGS. 3 and 4, one address is allocated to 16-bit data.

As shown in FIG. 3, the BCD clocking data T_BCD is stored in a storage area A having a size of four words in the RAM 101. In the 16-bit data in the first word stored in the storage area A, bits 15 to 7 are unused, bits 6 to 4 correspond to a tens digit of the second data, and bits 3 to 0 correspond to a units digit of the second data. In the 16-bit data in the second word stored in the storage area A, bits 15 to 13 are unused, bits 12 and 11 correspond to a tens digit of the hour data, bits 10 to 7 correspond to a units digit of the hour data, bits 6 to 4 correspond to a tens digit of the minute data, and bits 3 to 0 correspond to a units digit of the minute data. In the 16-bit data in the third word stored in the storage area A, bits 15 and 14 are unused, bits 13 to 11 correspond to the day-of-week data, bit 10 corresponds to a tens digit of the month data, bits 9 to 6 correspond to a units digit of the month data, bits 5 and 4 correspond to a tens digit of the date data, and bits 3 to 0 correspond to a units digit of the date data. In the 16-bit data in the fourth word stored in the storage area A, bits 15 to 12 correspond to a thousands digit of the year data, bits 11 to 8 correspond to a hundreds digit of the year data, bits 7 to 4 correspond to a tens digit of the year data, and bits 3 to 0 correspond to a units digit of the year data.

The BCD clocking data T BCD is also stored in a storage area B having a size of four words in the RAM 101. Since the bit allocation of the BCD clocking data T_BCD stored in the storage area B is the same as the bit allocation of the BCD clocking data T_BCD stored in the storage area A, the description thereof is omitted. As will be described later, the BCD clocking data T BCD stored in the storage area A and the BCD clocking data T_BCD stored in the storage area B always have a difference of one second. Specifically, when the BCD clocking data T BCD stored in the storage area A represents a current time point, the BCD clocking data T BCD stored in the storage area B represents a time point after one second. When the BCD clocking data T BCD stored in the storage area B indicates a current time point, the BCD clocking data T_BCD stored in the storage area A indicates a time point after one second.

As shown in FIG. 3, the binary clocking data T_BIN is stored in a storage area C having a size of three words in the RAM 101. In the 16-bit data in the first word stored in the storage area C, bits 15 to 8 are unused, and bits 7 to 0 correspond to bits 7 to 0 of the second data. In the 16-bit data in the second word stored in the storage area C, bits 15 to 0 correspond to bits 23 to 8 of the second data. In the 16-bit data in the third word stored in the storage area C, bits 15 to 9 are unused, and bits 8 to 0 correspond to bits 32 to 24 of the second data.

The binary clocking data T_BIN is also stored in a storage area D having a size of three words in the RAM 101. Since the bit allocation of the binary clocking data T_BIN stored in the storage area D is the same as the bit allocation of the binary clocking data T_BIN stored in the storage area C, the description thereof is omitted. As will be described later, the binary clocking data T_BIN stored in the storage area C and the binary clocking data T_BIN stored in the storage area D always have a difference of one second. Specifically, when the binary clocking data T_BIN stored in the storage area C represents a current time point, the binary clocking data T_BIN stored in the storage area D represents a time point after one second. When the binary clocking data T_BIN stored in the storage area D represents a current time point, the binary clocking data T_BIN stored in the storage area C represents a time point after one second.

As shown in FIG. 3, the BCD clocking data T BCD is stored in the storage area A or the storage area B having a size of four words by including the 7-bit second data in the 16-bit data in the first word, the 6-bit hour data and the 7-bit minute data in the 16-bit data in the second word, the 3-bit day-of-week data, the 5-bit month data, and the 6-bit date data in the 16-bit data in the third word, and the 16-bit year data in the 16-bit data in the fourth word. That is, in the BCD clocking data T_BCD, the second data, the minute data, the hour data, the date data, the day-of-week data, the month data, and the year data are not divided into seven pieces of 16-bit data and stored, but are compressed into four pieces of 16-bit data and stored in the RAM 101 of the memory 100. Therefore, the sizes of the storage areas A and B in which the BCD clocking data T_BCD is stored are reduced, and an area of the RAM 101 can be reduced.

As shown in FIG. 4, the BCD alarm first setting data A1_BCD is stored in a storage area E having a size of four words in the RAM 101. The BCD alarm second setting data A2_BCD is stored in a storage area F having a size of four words in the RAM 101. Since the bit allocation of the BCD alarm first setting data A1_BCD and the bit allocation of the BCD alarm second setting data A2_BCD are the same as the bit allocation of the BCD clocking data T_BCD, the description thereof is omitted.

As shown in FIGS. 3 and 4, the BCD alarm first setting data A1_BCD, the BCD alarm second setting data A2_BCD, and the BCD clocking data T_BCD have the same bit allocation, are compressed in the same format, and are stored in the RAM 101 of the memory 100. Therefore, the size of the storage area E in which the BCD alarm first setting data A1_BCD is stored and the size of the storage area F in which the BCD alarm second setting data A2_BCD is stored are reduced, and the area of the RAM 101 can be reduced.

As shown in FIG. 4, the binary alarm first setting data A1_BIN is stored in a storage area G having a size of three words in the RAM 101. The binary alarm second setting data A2_BIN is stored in a storage area H having a size of three words in the RAM 101. Since the bit allocation of the binary alarm first setting data A1_BIN and the bit allocation of the binary alarm second setting data A2_BIN are the same as the bit allocation of the binary clocking data T_BIN, the description thereof is omitted.

Returning to FIG. 2, the register group 110 includes an internal flag register 111, an external flag register 112, a first alarm selection register 113, a second alarm selection register 114, and a control register 115. The internal flag register 111 stores values of various flags not accessible from the host device 6. The external flag register 112 stores values of various flags accessible from the host device 6. The first alarm selection register 113 stores data for selecting a content of an alarm process based on the BCD alarm first setting data A1_BCD. The second alarm selection register 114 stores data for selecting a content of the alarm process based on the BCD alarm second setting data A2_BCD. The control register 115 stores data for controlling validity or invalidity of various clocking processes and alarm processes.

FIG. 5 is a diagram showing an example of the bit allocation of the data stored in various registers included in the register group 110. When the power supply voltage VLOGIC increases from 0 V and reaches a predetermined voltage value, bits of the various registers are initialized to 0.

As shown in FIG. 5, the internal flag register 111 is a 6-bit register, and stores a first pre-alarm flag FAlm1 in bit 0, stores a second pre-alarm flag FAlm2 in bit 1, stores a third pre-alarm flag FAlm3 in bit 2, stores a fourth pre-alarm flag FAlm4 in bit 3, stores a first current time point selection flag FBUF1 in bit 4, and stores a second current time point selection flag FBUF2 in bit 5.

When the data selected from the BCD clocking data T BCD representing the time point after one second coincides with the data selected from the BCD alarm first setting data A1_BCD, the first pre-alarm flag FAlm1 is set to 1. When the data selected from the BCD clocking data T_BCD does not coincide with the data selected from the BCD alarm first setting data A1_BCD, the first pre-alarm flag FAlm1 is reset to 0. The target data to be used in the comparison is selected by the first alarm selection register 113.

When the data selected from the BCD clocking data T BCD representing the time point after one second coincides with the data selected from the BCD alarm second setting data A2_BCD, the second pre-alarm flag FAlm2 is set to 1. When the data selected from the BCD clocking data T BCD does not coincide with the data selected from the BCD alarm second setting data A2_BCD, the second pre-alarm flag FAlm2 is reset to 0. The target data to be used in the comparison is selected by the second alarm selection register 114.

When the binary clocking data T_BIN representing the time point after one second coincides with the binary alarm first setting data A1_BIN, the third pre-alarm flag FAlm3 is set to 1. When the binary clocking data T_BIN does not coincide with the binary alarm first setting data A1_BIN, the third pre-alarm flag FAlm3 is reset to 0.

When the binary clocking data T_BIN representing the time point after one second coincides with the binary alarm second setting data A2_BIN, the fourth pre-alarm flag FAlm4 is set to 1. When the binary clocking data T_BIN does not coincide with the binary alarm second setting data A2_BIN, the fourth pre-alarm flag FAlm4 is reset to 0.

When the first current time point selection flag FBUF1 is 0, it indicates that the BCD clocking data T_BCD stored in the storage area A of the RAM 101 represents the current time point. When the first current time point selection flag FBUF1 is 1, it indicates that the BCD clocking data T BCD stored in the storage area B of the RAM 101 represents the current time point.

When the second current time point selection flag FBUF2 is 0, it indicates that the binary clocking data T_BIN stored in the storage area C of the RAM 101 represents the current time point. When the second current time point selection flag FBUF2 is 1, it indicates that the binary clocking data T_BIN stored in the storage area D of the RAM 101 represents the current time point.

As shown in FIG. 5, the external flag register 112 is a 6-bit register, and stores a first alarm flag FA1 in bit 0, stores a second alarm flag FA2 in bit 1, stores a third alarm flag FA3 in bit 2, stores a fourth alarm flag FA4 in bit 3, stores a first error flag FE1 in bit 4, and stores a second error flag FE2 in bit 5.

When the first pre-alarm flag FAlm1 is 1 at a time point update timing of every second, the first alarm flag FA1 is set to 1.

When the second pre-alarm flag FAlm2 is 1 at a time point update timing of every second, the second alarm flag FA2 is set to 1.

When the third pre-alarm flag FAlm3 is 1 at a time point update timing of every second, the third alarm flag FA3 is set to 1.

When the fourth pre-alarm flag FAlm4 is 1 at a time point update timing of every second, the fourth alarm flag FA4 is set to 1.

When the value of the BCD clocking data T_BCD is not included in a predetermined range corresponding to a range of time points at which the BCD clocking data T_BCD can exist, the first error flag FE1 is set to 1.

When the value of the binary clocking data T_BIN is not included in a predetermined range corresponding to a range of time points at which the binary clocking data T_BIN can exist, the second error flag FE2 is set to 1.

The host device 6 can access the external flag register 112. Each flag set to 1 is automatically reset to 0 by reading by the host device 6 or is reset to 0 by writing by the host device 6.

As shown in FIG. 5, the first alarm selection register 113 is a 7-bit register, and stores a second data selection bit XSAE in bit 0, stores a minute data selection bit XMIAE in bit 1, stores an hour data selection bit XHAE in bit 2, stores a date data selection bit XDAE in bit 3, stores a day-of-week data selection bit XWAE in bit 4, stores a month data selection bit XMOAE in bit 5, and stores a year data selection bit XYAE in bit 6.

When the second data selection bit XSAE is 0, it indicates that both pieces of second data are selected as comparison targets in a comparison process between the BCD clocking data T BCD and the BCD alarm first setting data A1_BCD. When the second data selection bit XSAE is 1, it indicates that both pieces of second data are not selected as the comparison targets in the comparison process.

When the minute data selection bit XMIAE is 0, it indicates that both pieces of minute data are selected as the comparison targets in the comparison process between the BCD clocking data T_BCD and the BCD alarm first setting data A1_BCD. When the minute data selection bit XMIAE is 1, it indicates that both pieces of minute data are not selected as the comparison targets in the comparison process.

When the hour data selection bit XHAE is 0, it indicates that both pieces of hour data are selected as the comparison targets in the comparison process between the BCD clocking data T BCD and the BCD alarm first setting data A1_BCD.

When the hour data selection bit XHAE is 1, it indicates that both pieces of hour data are not selected as the comparison targets in the comparison process.

When the date data selection bit XDAE is 0, it indicates that both pieces of date data are selected as the comparison targets in the comparison process between the BCD clocking data T BCD and the BCD alarm first setting data A1_BCD. When the date data selection bit XDAE is 1, it indicates that both pieces of date data are not selected as the comparison targets in the comparison process.

When the day-of-week data selection bit XWAE is 0, it indicates that both pieces of day-of-week data are selected as the comparison targets in the comparison process between the BCD clocking data T_BCD and the BCD alarm first setting data A1_BCD. When the day-of-week data selection bit XWAE is 1, it indicates that both pieces of day-of-week data are not selected as the comparison targets in the comparison process.

When the month data selection bit XMOAE is 0, it indicates that both pieces of month data are selected as the comparison targets in the comparison process between the BCD clocking data T BCD and the BCD alarm first setting data A1_BCD. When the month data selection bit XMOAE is 1, it indicates that both pieces of month data are not selected as the comparison targets in the comparison process.

When the year data selection bit XYAE is 0, it indicates that both pieces of year data are selected as the comparison targets in the comparison process between the BCD clocking data T BCD and the BCD alarm first setting data A1_BCD. When the year data selection bit XYAE is 1, it indicates that both pieces of year data are not selected as the comparison targets in the comparison process.

The host device 6 can access the first alarm selection register 113, and read and write each bit.

As shown in FIG. 5, the second alarm selection register 114 is a 7-bit register, and stores the second data selection bit XSAE in bit 0, stores the minute data selection bit XMIAE in bit 1, stores the hour data selection bit XHAE in bit 2, stores the date data selection bit XDAE in bit 3, stores the day-of-week data selection bit XWAE in bit 4, stores the month data selection bit XMOAE in bit 5, and stores the year data selection bit XYAE in bit 6.

When the second data selection bit XSAE is 0, it indicates that both pieces of second data are selected as comparison targets in a comparison process between the BCD clocking data T_BCD and the BCD alarm second setting data A2_BCD. When the second data selection bit XSAE is 1, it indicates that both pieces of second data are not selected as the comparison targets in the comparison process.

When the minute data selection bit XMIAE is 0, it indicates that both pieces of minute data are selected as the comparison targets in the comparison process between the BCD clocking data T_BCD and the BCD alarm second setting data A2_BCD. When the minute data selection bit XMIAE is 1, it indicates that both pieces of minute data are not selected as the comparison targets in the comparison process.

When the hour data selection bit XHAE is 0, it indicates that both pieces of hour data are selected as the comparison targets in the comparison process between the BCD clocking data T BCD and the BCD alarm second setting data A2_BCD. When the hour data selection bit XHAE is 1, it indicates that both pieces of hour data are not selected as the comparison targets in the comparison process.

When the date data selection bit XDAE is 0, it indicates that both pieces of date data are selected as the comparison targets in the comparison process between the BCD clocking data T_BCD and the BCD alarm second setting data A2_BCD. When the date data selection bit XDAE is 1, it indicates that both pieces of date data are not selected as the comparison targets in the comparison process.

When the day-of-week data selection bit XWAE is 0, it indicates that both pieces of day-of-week data are selected as the comparison targets in the comparison process between the BCD clocking data T BCD and the BCD alarm second setting data A2_BCD. When the day-of-week data selection bit XWAE is 1, it indicates that both pieces of day-of-week data are not selected as the comparison targets in the comparison process.

When the month data selection bit XMOAE is 0, it indicates that both pieces of month data are selected as the comparison targets in the comparison process between the BCD clocking data T_BCD and the BCD alarm second setting data A2_BCD. When the month data selection bit XMOAE is 1, it indicates that both pieces of month data are not selected as the comparison targets in the comparison process.

When the year data selection bit XYAE is 0, it indicates that both pieces of year data are selected as the comparison targets in the comparison process between the BCD clocking data T_BCD and the BCD alarm second setting data A2_BCD. When the year data selection bit XYAE is 1, it indicates that both pieces of year data are not selected as the comparison targets in the comparison process.

The host device 6 can access the second alarm selection register 114, and read and write each bit.

As shown in FIG. 5, the control register 115 is a 6-bit register, and stores a BCD clock valid bit BCDCE in bit 0, stores a binary clock valid bit BINCE in bit 1, stores a first alarm valid bit AE1 in bit 2, stores a second alarm valid bit AE2 in bit 3, stores a third alarm valid bit AE3 in bit 4, and stores a fourth alarm valid bit AE4 in bit 5.

When the BCD clock valid bit BCDCE is 0, it indicates that a BCD clocking mode for clocking a BCD time point is invalid. When the BCD clock valid bit BCDCE is 1, it indicates that the BCD clocking mode is valid.

When the binary clock valid bit BINCE is 0, it indicates that a binary clocking mode for clocking a binary time point is invalid. When the binary clock valid bit BINCE is 1, it indicates that the binary clocking mode is valid.

When the first alarm valid bit AE1 is 0, it indicates that a first alarm mode in which the alarm process based on the BCD alarm first setting data A1_BCD is performed is invalid. When the first alarm valid bit AE1 is 1, it indicates that the first alarm mode is valid.

When the second alarm valid bit AE2 is 0, it indicates that a second alarm mode in which the alarm process based on the BCD alarm second setting data A2_BCD is performed is invalid. When the second alarm valid bit AE2 is 1, it indicates that the second alarm mode is valid.

When the third alarm valid bit AE3 is 0, it indicates that a third alarm mode in which the alarm process based on the binary alarm first setting data A1_BIN is performed is invalid. When the third alarm valid bit AE3 is 1, it indicates that the third alarm mode is valid.

When the fourth alarm valid bit AE4 is 0, it indicates that a fourth alarm mode in which the alarm process based on the binary alarm second setting data A2_BIN is performed is invalid. When the fourth alarm valid bit AE4 is 1, it indicates that the fourth alarm mode is valid.

The host device 6 can access the control register 115, and read and write each bit.

Returning to FIG. 2, a program PG is stored in the nonvolatile memory 102. When the power supply voltage VLOGIC increases from 0 V and reaches the predetermined voltage value, the program PG stored in the nonvolatile memory 102 is transferred to the RAM 101 and stored as a program PGX in the RAM 101.

Returning to FIG. 1, in the embodiment, the processor 60 executes the program PGX stored in the RAM 101 to perform a clocking process of generating the clocking data 200 based on the third clock signal CK3. Specifically, the processor 60 reads first clocking data, which is the clocking data 200 corresponding to a current time point, from the RAM 101 based on the third clock signal CK3, generates second clocking data, which is the clocking data 200 corresponding to a next time point, based on the first clocking data, and stores the second clocking data in the RAM 101.

More specifically, when the BCD clock mode is valid, that is, when the BCD clock valid bit BCDCE in the control register 115 is 1, if the first current time point selection flag FBUF1 is 1 at a time point update timing when the pulse of the third clock signal CK3 is generated, the processor 60 changes the first current time point selection flag FBUF1 to 0, reads the BCD clocking data T_BCD corresponding to the current time point stored in the storage area A of the RAM 101, generates the BCD clocking data T BCD corresponding to a time point after one second based on the read BCD clocking data T_BCD and the clocking data SEC_BCD generated by the second counter 40, and stores the generated BCD clocking data T BCD to the storage area B of the RAM 101. When the first current time point selection flag FBUF1 is 0 at the time point update timing when the pulse of the third clock signal CK3 is generated, the processor 60 changes the first current time point selection flag FBUF1 to 1, reads the BCD clocking data T BCD corresponding to the current time point stored in the storage area B of the RAM 101, generates the BCD clocking data T BCD corresponding to a time point after one second based on the read BCD clocking data T BCD and the clocking data SEC_BCD generated by the second counter 40, and stores the generated BCD clocking data T_BCD to the storage area A of the RAM 101. In this way, the processor 60 generates the BCD clocking data T BCD by a double buffer method using the two storage areas A and B of the RAM 101. When the BCD clocking mode is invalid, that is, when the BCD clock valid bit BCDCE in the control register 115 is 0, the processor 60 does not perform the process of generating the BCD clocking data T_BCD.

Similarly, when the binary clocking mode is valid, that is, when the binary clock valid bit BINCE in the control register 115 is 1, if the second current time point selection flag FBUF2 is 1 at the time point update timing at which the pulse of the third clock signal CK3 is generated, the processor 60 changes the second current time point selection flag FBUF2 to 0, reads the binary clocking data T_BIN corresponding to the current time point stored in the storage area C of the RAM 101, generates the binary clocking data T_BIN corresponding to a time point after one second based on the read binary clocking data T_BIN and the clocking data SEC_BIN generated by the third counter 50, and stores the generated binary clocking data T_BIN to the storage area D of the RAM 101. When the second current time point selection flag FBUF2 is 0 at the time point update timing at which the pulse of the third clock signal CK3 is generated, the processor 60 changes the second current time point selection flag FBUF2 to 1, reads the binary clocking data T_BIN corresponding to the current time point stored in the storage area D of the RAM 101, generates the binary clocking data T_BIN corresponding to a time point after one second based on the read binary clocking data T_BIN and the clocking data SEC BIN generated by the third counter 50, and stores the generated binary clocking data T_BIN to the storage area C of the RAM 101. In this way, the processor 60 generates the binary clocking data T_BIN by a double buffer method using the two storage areas C and D of the RAM 101. When the binary clocking mode is invalid, that is, when the binary clock valid bit BINCE in the control register 115 is 0, the processor 60 does not perform the process of generating the binary clocking data T_BIN.

In this way, the clocking data 200 is directly generated based on the third clock signal CK3. Since the third clock signal CK3 is generated based on the first clock signal CK1, it can be said that the clocking data 200 is generated based on the first clock signal CK1.

In the embodiment, the processor 60 executes the program PGX stored in the RAM 101 to perform a comparison process of comparing the clocking data 200 with the alarm setting data 210 stored in the RAM 101, and performs an alarm process of outputting an alarm signal SALM according to a result of the comparison process. Specifically, the processor 60 compares the second clocking data, which is the clocking data 200 corresponding to the next time point, with the alarm setting data 210. When the second clocking data coincides with the alarm setting data 210, the processor 60 outputs the alarm signal SALM at the next time point update timing.

More specifically, when the first alarm mode is valid, that is, when the first alarm valid bit AE1 in the control register 115 is 1, the processor 60 compares the BCD clocking data T_BCD corresponding to a time point after one second with the BCD alarm first setting data A1_BCD at the time point update timing at which the pulse of the third clock signal CK3 is generated, sets the first pre-alarm flag FAlm1 to 1 when both pieces of data coincide with each other, and resets the first pre-alarm flag FAlm1 to 0 when both pieces of data do not coincide with each other. The target data to be used in comparison between the BCD clocking data T_BCD and the BCD alarm first setting data A1_BCD is selected according to the value of each bit in the first alarm selection register 113. When the second alarm mode is valid, that is, when the second alarm valid bit AE2 in the control register 115 is 1, the processor 60 compares the BCD clocking data T BCD corresponding to a time point after one second with the BCD alarm second setting data A2_BCD at the time point update timing when the pulse of the third clock signal CK3 is generated, sets the second pre-alarm flag FAlm2 to 1 when both pieces of data coincide with each other, and resets the second pre-alarm flag FAlm2 to 0 when both pieces of data do not coincide with each other. The target data to be used in comparison between the BCD clocking data T_BCD and the BCD alarm second setting data A2_BCD is selected according to the value of each bit in the second alarm selection register 114. Then, at a next time point update timing at which a next pulse of the third clock signal CK3 is generated, the processor 60 sets the first alarm flag FA1 to 1 when the first pre-alarm flag FAlm1 is 1, sets the second alarm flag FA2 to 1 when the second pre-alarm flag FAlm2 is 1, and outputs the alarm signal SALM when at least one of the first pre-alarm flag FAlm1 and the second pre-alarm flag FAlm2 is 1.

Similarly, when the third alarm mode is valid, that is, when the third alarm valid bit AE3 in the control register 115 is 1, the processor 60 compares the binary clocking data T_BIN corresponding to a time point after one second with the binary alarm first setting data A1_BIN at the time point update timing at which the pulse of the third clock signal CK3 is generated, sets the third pre-alarm flag FAlm3 to 1 when both pieces of data coincide with each other, and resets the third pre-alarm flag FAlm3 to 0 when both pieces of data do not coincide with each other. When the fourth alarm mode is valid, that is, when the fourth alarm valid bit AE4 in the control register 115 is 1, the processor 60 compares the binary clocking data T_BIN corresponding to a time point after one second with the binary alarm second setting data A2_BIN at the time point update timing at which the pulse of the third clock signal CK3 is generated, sets the fourth pre-alarm flag FAlm4 to 1 when both pieces of data coincide with each other, and resets the fourth pre-alarm flag FAlm4 to 0 when both pieces of data do not coincide with each other. Then, at a next time point update timing at which a next pulse of the third clock signal CK3 is generated, the processor 60 sets the third alarm flag FA3 to 1 when the third pre-alarm flag FAlm3 is 1, sets the fourth alarm flag FA4 to 1 when the fourth pre-alarm flag FAlm4 is 1, and outputs the alarm signal SALM when at least one of the third pre-alarm flag FAlm3 and the fourth pre-alarm flag FAlm4 is 1.

As shown in FIGS. 3 and 4, since the BCD alarm first setting data A1_BCD, the BCD alarm second setting data A2_BCD, and the BCD clocking data T_BCD have the same bit allocation, the processor 60 can easily perform the comparison process between the BCD clocking data T BCD and the BCD alarm first setting data A1_BCD and the comparison process between the BCD clocking data T_BCD and the BCD alarm second setting data A2_BCD. Similarly, since the binary alarm first setting data A1_BIN, the binary alarm second setting data A2_BIN, and the binary clocking data T_BIN have the same bit allocation, the processor 60 can easily perform the comparison process between the binary clocking data T_BIN and the binary alarm first setting data A1_BIN and the comparison process between the binary clocking data T_BIN and the binary alarm second setting data A2_BIN.

In the embodiment, when the value of the clocking data 200 is not included in the predetermined range, the processor 60 performs at least one of a process of outputting an error signal SERR, a process of stopping update of the clocking data 200, and a process of initializing the clocking data 200 to a value included in the predetermined range. For example, when the value of the BCD clocking data T BCD is not included in the predetermined range corresponding to the range of the time points at which the BCD clocking data T_BCD can exist, for example, when the value is 00:00:00 on February 30, the processor 60 sets the first error flag FE1 to 1 and outputs the error signal SERR. When the value of the binary clocking data T_BIN is not included in the predetermined range corresponding to the range of the time points at which the binary clocking data T_BIN can exist, the processor 60 sets the second error flag FE2 to 1 and outputs the error signal SERR. The processor 60 may stop the update of the BCD clocking data T_BCD when the value of the BCD clocking data T_BCD is not included in the predetermined range, and may stop the update of the binary clocking data T_BIN when the value of the binary clocking data T_BIN is not included in the predetermined range. The processor 60 may initialize the BCD clocking data T BCD to a predetermined value within the predetermined range when the value of the BCD clocking data T_BCD is not included in the predetermined range, and may initialize the binary clocking data T_BIN to a predetermined value within the predetermined range when the value of the binary clocking data T_BIN is not included in the predetermined range. The predetermined value may be, for example, data in which all bits are 0.

The write buffer 70 acquires and stores write data WDAT output from the interface circuit 90. A part of the write data WDAT stored in the write buffer 70 is input to each of the first counter 30, the second counter 40, the third counter 50, and the processor 60.

In response to a read request signal (not shown) from the interface circuit 90, the read buffer 80 acquires and stores at least one of the clocking data SUBSEC, SEC_BIN, and SEC_BCD generated by the first counter 30, the second counter 40, and the third counter 50, respectively, and the BCD clocking data T BCD and the binary clocking data T_BIN generated by the processor 60, and outputs the stored clocking data to the interface circuit 90 as read data RDAT.

The interface circuit 90 is an interface circuit for communication between the real-time clock module 1 and the host device 6. In the embodiment, the interface circuit 90 is an interface circuit corresponding to an I$^2$C bus, and communicates with the host device 6 based on a serial clock signal SCL input via a terminal P6 of the real-time clock circuit 3 and a serial data signal SDA input and output via a terminal P7 of the real-time clock circuit 3. The I$^2$C is an abbreviation for inter-integrated circuit. However, the interface circuit 90 may be an interface circuit corresponding to other serial buses such as SPI, or may be an interface circuit corresponding to a parallel bus. The SPI is an abbreviation for serial peripheral interface.

The interface circuit 90 receives an access signal from the host device 6 via the terminals P6 and P7, and performs various processes according to the received access signal.

Specifically, when the interface circuit 90 receives an access signal requesting a time point setting from the host device 6, the interface circuit 90 transfers, as the write data WDAT, time point data included in the access signal to the write buffer 70.

Thereafter, when the clocking data SUBSEC is a write target, the interface circuit 90 outputs a write clock signal to the first counter 30. The first counter 30 updates, according to the write clock signal, the clocking data SUBSEC to time point data representing a time point in units of $1/1024$ seconds included in the data transferred to the write buffer 70.

When the clocking data SEC BCD is the write target, the interface circuit 90 outputs the write clock signal to the second counter 40, and updates the clocking data SEC BCD to BCD-format second data included in the data transferred to the write buffer 70. When the clocking data SEC_BIN is the write target, the interface circuit 90 outputs the write clock signal to the third counter 50, and updates the clocking data SEC_BIN to lower 8-bit data of binary-format time point data included in the data transferred to the write buffer 70.

When the BCD clocking data T_BCD is the write target, the interface circuit 90 outputs a write request signal for the BCD clocking data T_BCD to the processor 60. The processor 60 writes at least part of the data transferred to the write buffer 70 to the storage area A of the RAM 101 to update at least part of the year data, the month data, the day-of-week data, the date data, the hour data, the minute data, and the second data of the BCD clocking data T_BCD. When the day-of-week data is not the write target, the processor 60 may calculate the day-of-week data based on the year data, the month data, and the date data.

When the binary clocking data T_BIN is the write target, the interface circuit 90 outputs the write request signal for the binary clocking data T_BIN to the processor 60. The processor 60 writes the data transferred to the write buffer 70 to the storage area C of the RAM 101 to update the binary clocking data T_BIN.

When the interface circuit 90 receives, from the host device 6, an access signal requesting the read of at least one of the clocking data SUBSEC, SEC_BCD, SEC_BIN, T_BCD, and T_BIN, the interface circuit 90 generates a read request signal (not shown) requesting the read of the clocking data to be read, and outputs the read request signal to the read buffer 80. Then, the interface circuit 90 acquires the read data RDAT, which is the clocking data to be read acquired and stored by the read buffer 80, converts the read data RDAT into the serial data signal SDA, and transmits the serial data signal SDA to the host device 6 via the terminal P7.

When the interface circuit 90 receives an access signal requesting an alarm setting from the host device 6, the interface circuit 90 transfers, as the write data WDAT, the alarm setting data included in the access signal to the write buffer 70, and outputs a write request signal (not shown) requesting the write of alarm setting data to be written to the processor 60.

Thereafter, when the BCD alarm first setting data A1_BCD is the write target, the interface circuit 90 outputs a write request signal for the BCD alarm first setting data A1_BCD to the processor 60. The processor 60 writes the data transferred to the write buffer 70 to the storage area E of the RAM 101 to update the BCD alarm first setting data A1_BCD. When the BCD alarm second setting data A2_BCD is the write target, the interface circuit 90 outputs a write request signal for the BCD alarm second setting data A2_BCD to the processor 60. The processor 60 writes the data transferred to the write buffer 70 to the storage area F of the RAM 101 to update the BCD alarm second setting data A2_BCD.

When the binary alarm first setting data A1_BIN is the write target, the interface circuit 90 outputs a write request signal for the binary alarm first setting data A1_BIN to the processor 60. The processor 60 writes the data transferred to the write buffer 70 to the storage area G of the RAM 101 to update the binary alarm first setting data A1_BIN. When the binary alarm second setting data A2_BIN is the write target, the interface circuit 90 outputs a write request signal for the binary alarm second setting data A2_BIN to the processor 60. The processor 60 writes the data transferred to the write buffer 70 to the storage area H of the RAM 101 to update the binary alarm second setting data A2_BIN.

When the interface circuit 90 receives, from the host device 6, an access signal requesting the write or the read of the data to or from the nonvolatile memory 102 of the memory 100, the interface circuit 90 writes or reads the data to or from the nonvolatile memory 102. The interface circuit 90 may receive the access signal requesting the write or the read of the data to or from the RAM 101 of the memory 100 and writes or reads the data to or from the RAM 101. That is, the write or the read for the BCD clocking data T_BCD, the binary clocking data T_BIN, the BCD alarm first setting data A1_BCD, the BCD alarm second setting data A2_BCD, the binary alarm first setting data A1_BIN, and the binary alarm second setting data A2_BIN may be performed by DMA without the processor 60. The DMA is an abbreviation for direct memory access.

When the interface circuit 90 receives, from the host device 6, an access signal requesting the write or the read of the data to or from the external flag register 112, the first alarm selection register 113, the second alarm selection register 114, or the control register 115 included in the register group 110, the interface circuit 90 writes or reads the data to or from a target register.

The interrupt generation circuit 120 generates an interrupt signal XINT when at least one of the alarm signal SALM and the error signal SERR is output from the processor 60, and outputs the interrupt signal XINT to the host device 6 via a terminal P5 of the real-time clock circuit 3. When the host device 6 receives the interrupt signal XINT, the host device 6 reads the data stored in the external flag register 112 via the interface circuit 90, thereby analyzing an occurrence cause of the interrupt signal XINT.

The processor 60 includes, for example, a register that sequentially acquires a plurality of instruction codes constituting the program PGX from the RAM 101 in synchronization with a clock signal, a decoder that decodes the instruction codes acquired by the register, an ALU that performs various operations such as addition, subtraction, logical calculation, and bit shift calculation, two accumulators that store two pieces of data input to the ALU in synchronization with the clock signal, and a plurality of registers that store calculation result data obtained by the ALU in synchronization with the clock signal. The ALU is an abbreviation for arithmetic logic unit. For example, the processor 60 performs various data loads, various calculations, and the like according to each instruction code by a pipeline process in synchronization with the clock signal. Therefore, the clocking process and the alarm process performed every second by the processor 60 require a time corresponding to about 10 pulses of the clock signal, and a cycle of the clock signal for operating the processor 60 needs to be sufficiently shorter than one second. Therefore, as the clock signal, for example, the first clock signal CK1 or the second clock signal CK2 may be used, an oscillation signal generated by an RC oscillation circuit (not shown) may be used, or the serial clock signal SCL transmitted from the host device 6 may be used.

Further, a considerable amount of time is required from when the host device 6 transmits a command requesting a time point setting, an alarm setting, or a time point read to when the processor 60 completes a process in response to the request. Therefore, a busy flag may be provided in the external flag register 112. The processor 60 may set the busy flag to 1 during a period from the start to the completion of the process, and may prohibit transmission of a new request command from the host device 6 when the busy flag is 1. Alternatively, the processor 60 may output a busy signal at a high level to the host device 6 during the period from the start to the completion of the process, and prohibit the transmission of the new request command from the host device 6 when the busy flag is at the high level. Alternatively, when the host device 6 requests the time point setting, the alarm setting, or the time point read, the host device 6 may set a standby time equal to or longer than a specified time until the host device 6 transmits the next request command, or may transmit a specified number of dummy commands until the host device 6 transmits the next request command.

When a time point update timing occurs from the start to the completion of the process of the processor 60 in response to the command requesting the time point setting, the alarm setting, or the time point read, a special process such as delaying the time point update is required. In order to avoid the occurrence of such a special process, the processor 60 may output a dedicated signal to notify the host device 6 of an appropriate timing for transmitting the request command. The host device 6 may transmit the next request command within a specified time from the dedicated signal. Alternatively, the processor 60 may notify the host device 6 of the time point update timing. The host device 6 may transmit the next request command within a specified time after a specified time required to complete the clocking process elapses in response to the notification.

1-2. Process in Real-Time Clock Module

FIG. 6 is a flowchart showing an example of a procedure of a process executed by the real-time clock module 1. It is assumed that each unit of the real-time clock module 1 starts the operation prior to the process shown in FIG. 6. In addition to the process shown in FIG. 6, the real-time clock module 1 also performs various processes such as a process of writing and reading data to and from various registers included in the register group 110.

As shown in FIG. 6, in step S1, when there is a time point setting request from the host device 6, in step S2, the real-time clock module 1 performs a time point setting process of setting a value of a designated time point to designated clocking data. When there is no time point setting request from the host device 6 in step S1, the real-time clock module 1 does not perform the time point setting process in step S2. Details of a procedure of the time point setting process will be described later.

Next, in step S3, when there is a time point read request from the host device 6, in step S4, the real-time clock module 1 performs a time point read process of outputting the designated clocking data to the host device 6. When there is no time point read request from the host device 6 in step S3, the real-time clock module 1 does not perform the time point read process in step S4. Details of a procedure of the time point read process will be described later.

Next, in step S5, when there is an alarm setting request from the host device 6, in step S6, the real-time clock module 1 performs an alarm setting process of setting a value of the designated time point to designated alarm setting data. When there is no alarm setting request from the host device 6 in step S5, the real-time clock module 1 does not perform the alarm setting process in step S6. Details of a procedure of the alarm setting process will be described later.

Next, in step S7, when a time point update timing based on the third clock signal CK3 arrives, in step S8, the real-time clock module 1 performs a time point update process of updating the clocking data 200 stored in the RAM 101. When the time point update timing does not arrive in step S7, the real-time clock module 1 does not perform the time point update process in step S8. Details of a procedure of the time point update process will be described later.

Then, in step S9, the real-time clock module 1 repeats the processes in steps S1 to S8 until the clocking is completed by an instruction or the like from the host device 6.

Figure 7:
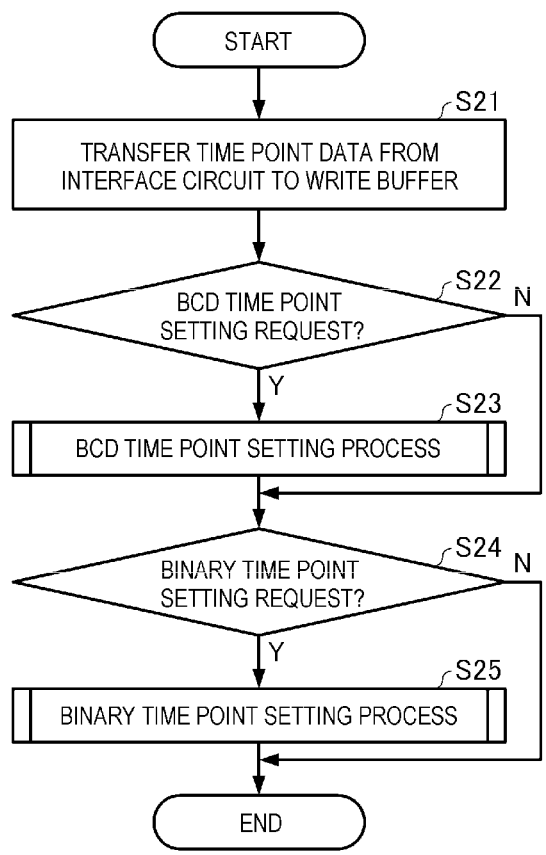
FIG. 7 is a flowchart showing an example of a procedure of a time point setting process in step S2 in FIG. 6.

FIG. 7 is a flowchart showing an example of the procedure of the time point setting process in step S2 in FIG. 6.

As shown in FIG. 7, first, in step S21, time point data is transferred from the interface circuit 90 to the write buffer 70.

Next, in step S22, when a request from the host device 6 is a BCD-format time point setting, in step S23, the real-time clock module 1 performs a BCD time point setting process of setting BCD-format time point data stored in the write buffer 70 to the designated data among the data included in the BCD clocking data T_BCD and the clocking data SEC BCD. When the request from the host device 6 is not the BCD-format time point setting in step S22, the real-time clock module 1 does not perform the BCD time point setting process in step S23. Details of a procedure of the BCD time point setting process will be described later.

Next, in step S24, when the request from the host device 6 is a binary-format time point setting, in step S25, the real-time clock module 1 performs a binary time point setting process of setting binary-format time point data stored in the write buffer 70 to the binary clocking data T_BIN and the clocking data SEC_BIN. When the request from the host device 6 is not the binary-format time point setting in step S24, the real-time clock module 1 does not perform the binary time point setting process in step S25. Details of a procedure of the binary time point setting process will be described later.

Figure 8:
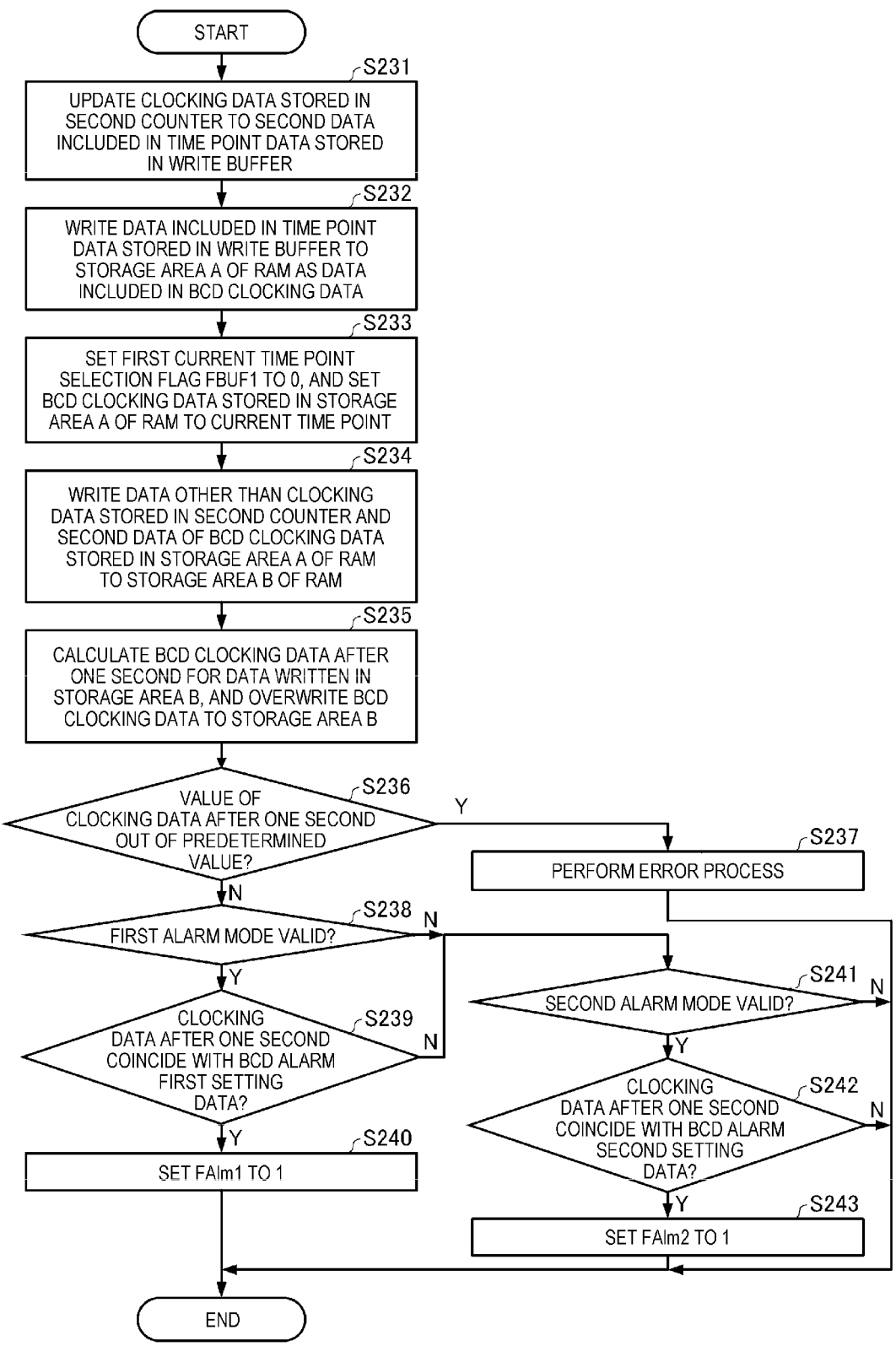
FIG. 8 is a flowchart showing an example of a procedure of a BCD time point setting process in step S23 in FIG. 7.

FIG. 8 is a flowchart showing an example of the procedure of the BCD time point setting process in step S23 in FIG. 7.

As shown in FIG. 8, first, in step S231, the clocking data SEC_BCD stored in the second counter 40 is updated to the second data included in the time point data stored in the write buffer 70.

Next, in step S232, the processor 60 writes, as data included in the BCD clocking data T_BCD, the data of the year data, the month data, the day-of-week data, the date data, the hour data, the minute data, and the second data included in the time point data stored in the write buffer 70 to the storage area A of the RAM 101.

Next, in step S233, the processor 60 sets the first current time point selection flag FBUF1 to 0 and sets the BCD clocking data T_BCD stored in the storage area A of the RAM 101 to the current time point.

Next, in step S234, the processor 60 writes data other than the clocking data SEC BCD stored in the second counter 40 and the second data of the BCD clocking data T_BCD stored in the storage area A of the RAM 101 to the storage area B of the RAM 101.

Next, in step S235, the processor 60 calculates the BCD clocking data T_BCD after one second for the data written in the storage area B in step S234, and overwrites the BCD clocking data T_BCD to the storage area B.

Next, in step S236, the processor 60 determines whether a value of the BCD clocking data T_BCD after one second calculated in step S235 is out of a predetermined range. Then, when the value of the BCD clocking data T_BCD after one second is out of the predetermined range in step S236, the processor 60 performs an error process in step S237. For example, the processor 60 performs, as the error process, at least one of a process of outputting the error signal SERR, a process of stopping the update of the BCD clocking data T_BCD, and a process of initializing the BCD clocking data T_BCD to a value included in the predetermined range. For example, a content of the error process may be selectable by the host device 6. The processor 60 sets the first error flag FE1 to 1, and the interrupt generation circuit 120 generates the interrupt signal XINT based on the error signal SERR.

When the value of the BCD clocking data T_BCD after one second is within the predetermined range in step S236, and when the first alarm mode is valid in step S238, the processor 60 determines whether the BCD clocking data T_BCD after one second coincides with the BCD alarm first setting data A1_BCD in step S239. Then, when the BCD clocking data T_BCD after one second coincides with the BCD alarm first setting data A1_BCD in step S239, the processor 60 sets the first pre-alarm flag FAlm1 to 1 in step S240.

When the first alarm mode is invalid in step S238, or when the BCD clocking data T_BCD after one second does not coincide with the BCD alarm first setting data A1_BCD in step S239, if the second alarm mode is valid in step S241, the processor 60 determines whether the BCD clocking data T_BCD after one second coincides with the BCD alarm second setting data A2_BCD in step S242. Then, when the BCD clocking data T_BCD after one second coincides with the BCD alarm second setting data A2_BCD in step S242, the processor 60 sets the second pre-alarm flag FAlm2 to 1 in step S243.

Figure 9:
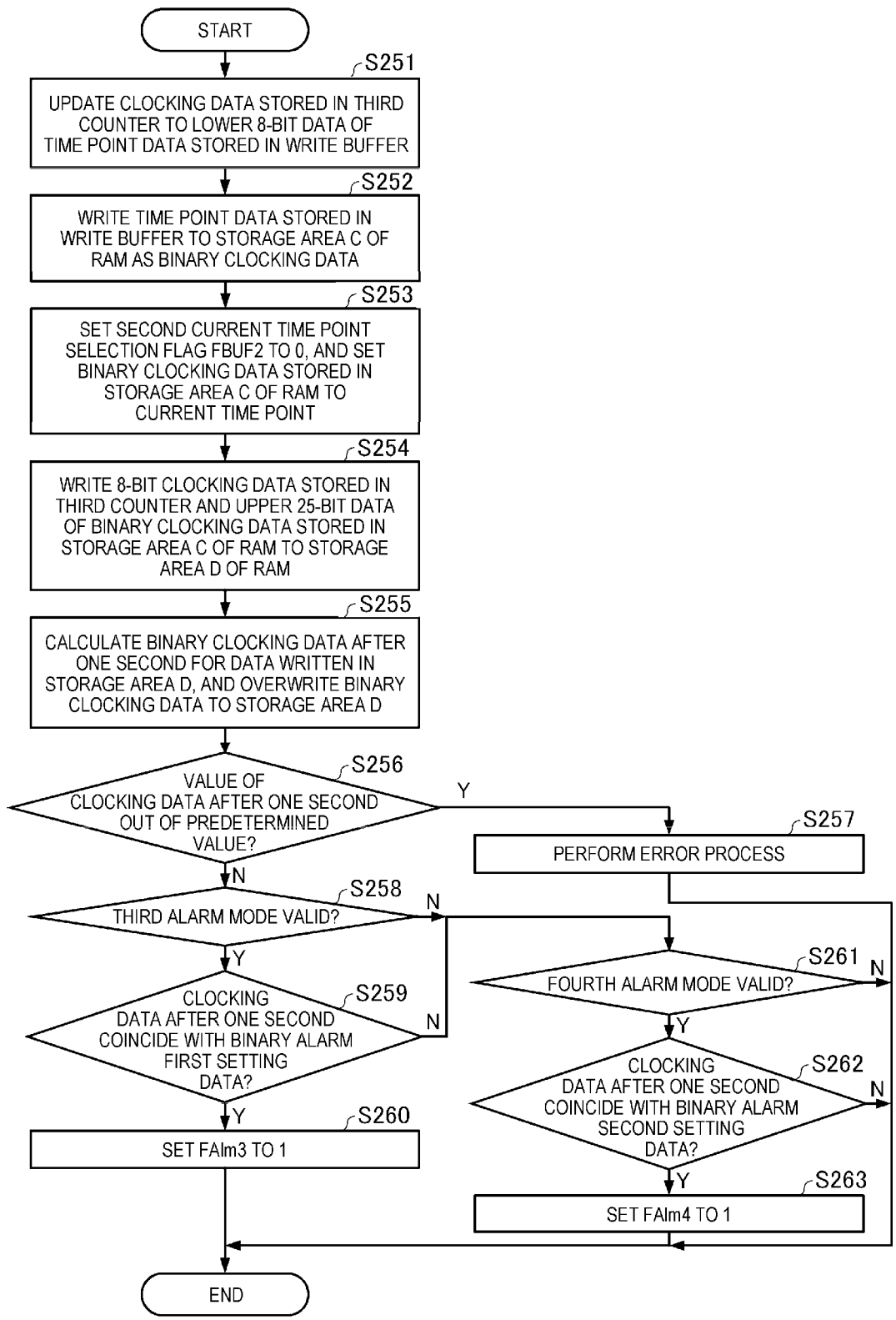
FIG. 9 is a flowchart showing an example of a procedure of a binary time point setting process in step S25 in FIG. 7.

FIG. 9 is a flowchart showing an example of the procedure of the binary time point setting process in step S25 in FIG. 7.

As shown in FIG. 9, first, in step S251, the clocking data SEC_BIN stored in the third counter 50 is updated to lower 8-bit data as the time point data stored in the write buffer 70.

Next, in step S252, the processor 60 writes, as the binary clocking data T_BIN, the time point data stored in the write buffer 70 to the storage area C of the RAM 101.

Next, in step S253, the processor 60 sets the second current time point selection flag FBUF2 to 0 and sets the binary clocking data T_BIN stored in the storage area C of the RAM 101 to the current time point.

Next, in step S254, the processor 60 writes the 8-bit clocking data SEC_BIN stored in the third counter 50 and upper 25-bit data of the binary clocking data T_BIN stored in the storage area C of the RAM 101 to the storage area D of the RAM 101.

Next, in step S255, the processor 60 calculates the binary clocking data T_BIN after one second for the data written in the storage area D in step S254, and overwrites the binary clocking data T_BIN to the storage area D.

Next, in step S256, the processor 60 determines whether a value of the binary clocking data T_BIN after one second calculated in step S255 is out of a predetermined range. Then, when the value of the binary clocking data T_BIN after one second is out of the predetermined range in step S256, the processor 60 performs the error process in step S257. For example, the processor 60 performs, as the error process, at least one of the process of outputting the error signal SERR, the process of stopping the update of the binary clocking data T_BIN, and the process of initializing the binary clocking data T_BIN to a value included in the predetermined range. For example, a content of the error process may be selectable by the host device 6. The processor 60 sets the second error flag FE2 to 1, and the interrupt generation circuit 120 generates the interrupt signal XINT based on the error signal SERR.

When the value of the binary clocking data T_BIN after one second is within the predetermined range in step S256, and when the third alarm mode is valid in step S258, the processor 60 determines whether the binary clocking data T_BIN after one second coincides with the binary alarm first setting data A1_BIN in step S259. Then, when the binary clocking data T_BIN after one second coincides with the binary alarm first setting data A1_BIN in step S259, the processor 60 sets the third pre-alarm flag FAlm3 to 1 in step S260.

When the third alarm mode is invalid in step S258, or when the binary clocking data T_BIN after one second does not coincide with the binary alarm first setting data A1_BIN in step S259, if the fourth alarm mode is valid in step S261, the processor 60 determines whether the binary clocking data T_BIN after one second coincides with the binary alarm second setting data A2_BIN in step S262. Then, when the binary clocking data T_BIN after one second coincides with the binary alarm second setting data A2_BIN in step S262, the processor 60 sets the fourth pre-alarm flag FAlm4 to 1 in step S263.

Figure 10:
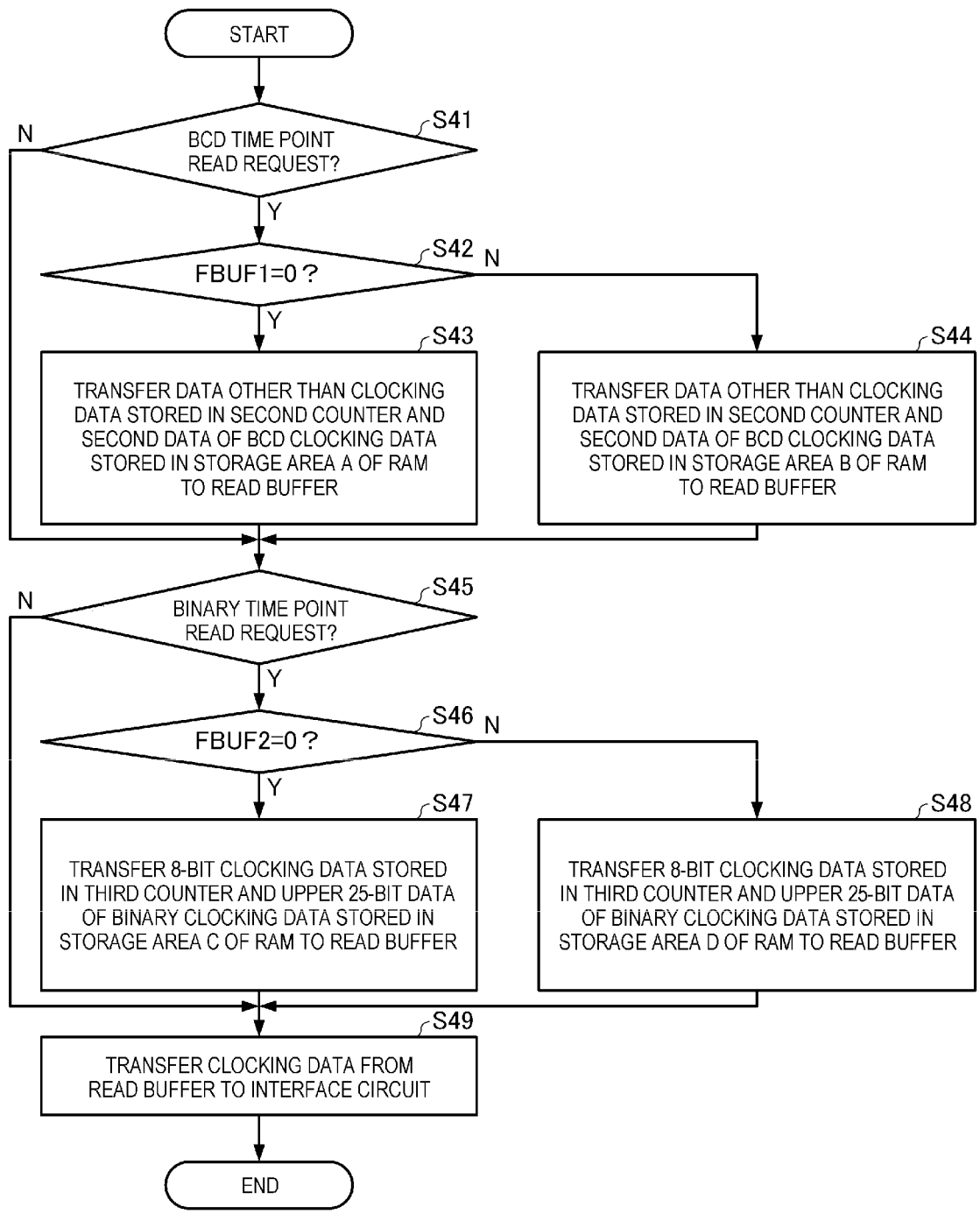
FIG. 10 is a flowchart showing an example of a procedure of a time point read process in step S4 in FIG. 6.

FIG. 10 is a flowchart showing an example of the procedure of the time point read process in step S4 in FIG. 6.

As shown in FIG. 10, when the request from the host device 6 is BCD-format time point read in step S41, if the first current time point selection flag FBUF1 is 0 in step S42, the processor 60 transfers data other than the clocking data SEC_BCD stored in the second counter 40 and the second data of the BCD clocking data T_BCD stored in the storage area A of the RAM 101 to the read buffer 80 in step S43.

When the first current time point selection flag FBUF1 is 1 in step S42, the processor 60 transfers data other than the clocking data SEC_BCD stored in the second counter 40 and the second data of the BCD clocking data T_BCD stored in the storage area B of the RAM 101 to the read buffer 80 in step S44.

In step S41, when the request from the host device 6 is not the BCD-format time point read, the processor 60 does not perform the processes in steps S42, S43, and S44.

Next, in step S45, when the request from the host device 6 is binary-format time point read, if the second current time point selection flag FBUF2 is 0 in step S46, the processor 60 transfers the 8-bit clocking data SEC_BIN stored in the third counter 50 and the upper 25-bit data of the binary clocking data T_BIN stored in the storage area C of the RAM 101 to the read buffer 80 in step S47.

When the second current time point selection flag FBUF2 is 1 in step S46, the processor 60 transfers the 8-bit clocking data SEC_BIN stored in the third counter 50 and the upper 25-bit data of the binary clocking data T_BIN stored in the storage area D of the RAM 101 to the read buffer 80 in step S48.

In step S45, when the request from the host device 6 is not the binary-format time point read, the processor 60 does not perform the processes in steps S46, S47, and S48.

Then, in step S49, the BCD-format or binary-format clocking data is transferred from the read buffer 80 to the interface circuit 90.

Figure 11:
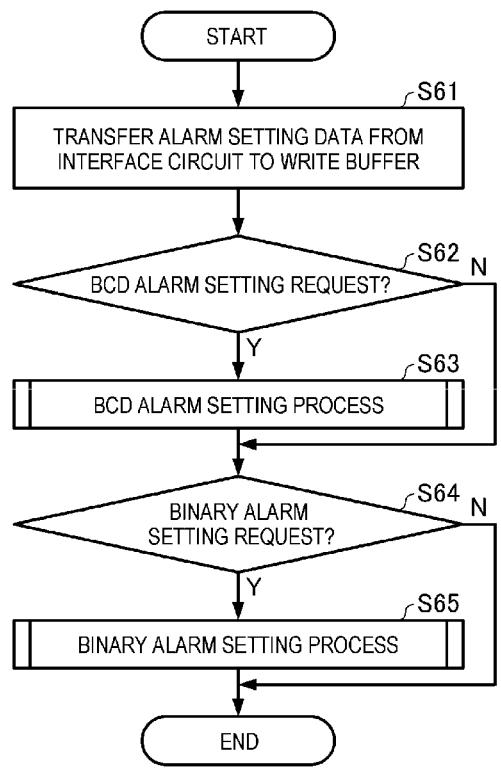
FIG. 11 is a flowchart showing an example of a procedure of an alarm setting process in step S6 in FIG. 6.

FIG. 11 is a flowchart showing an example of the procedure of the alarm setting process in step S6 in FIG. 6.

As shown in FIG. 11, first, in step S61, the alarm setting data is transferred from the interface circuit 90 to the write buffer 70.

Next, in step S62, when the request from the host device 6 is the BCD-format alarm setting, in step S63, the real-time clock module 1 performs the BCD alarm setting process of setting the BCD-format alarm setting data stored in the write buffer 70 to designated setting data included in the BCD alarm setting data 211. When the request from the host device 6 is not the BCD-format alarm setting in step S62, the real-time clock module 1 does not perform the BCD alarm setting process in step S63. Details of a procedure of the BCD alarm setting process will be described later.

Next, in step S64, when the request from the host device 6 is the binary-format alarm setting, in step S65, the real-time clock module 1 performs the binary alarm setting process of setting the binary-format alarm setting data stored in the write buffer 70 to designated setting data included in the binary alarm setting data 212. When the request from the host device 6 is not the binary-format alarm setting in step S64, the real-time clock module 1 does not perform the binary alarm setting process in step S65. Details of a procedure of the binary alarm setting process will be described later.

Figure 12:
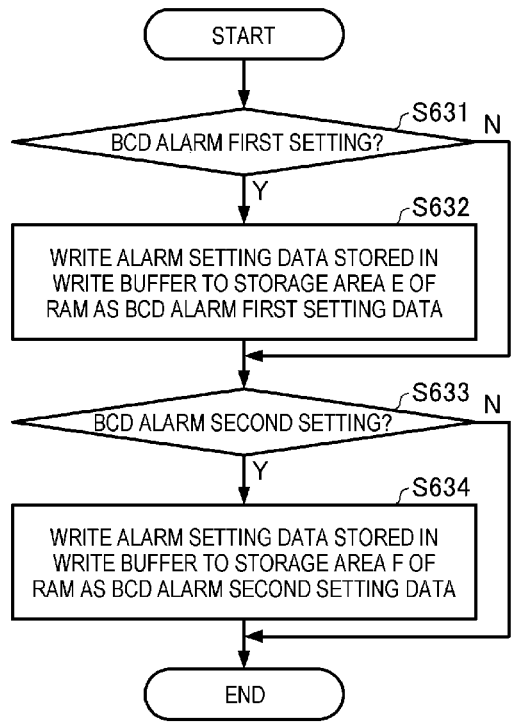
FIG. 12 is a flowchart showing an example of a procedure of a BCD alarm setting process in step S63 in FIG. 11.

FIG. 12 is a flowchart showing an example of the procedure of the BCD alarm setting process in step S63 in FIG. 11.

As shown in FIG. 12, in step S631, when the request from the host device 6 is a BCD alarm first setting, in step S632, the processor 60 writes, as the BCD alarm first setting data A1_BCD, the alarm setting data stored in the write buffer 70 to the storage area E of the RAM 101.

Next, in step S633, when the request from the host device 6 is a BCD alarm second setting, in step S634, the processor 60 writes, as the BCD alarm second setting data A2_BCD, the alarm setting data stored in the write buffer 70 to the storage area F of the RAM 101.

Figure 13:
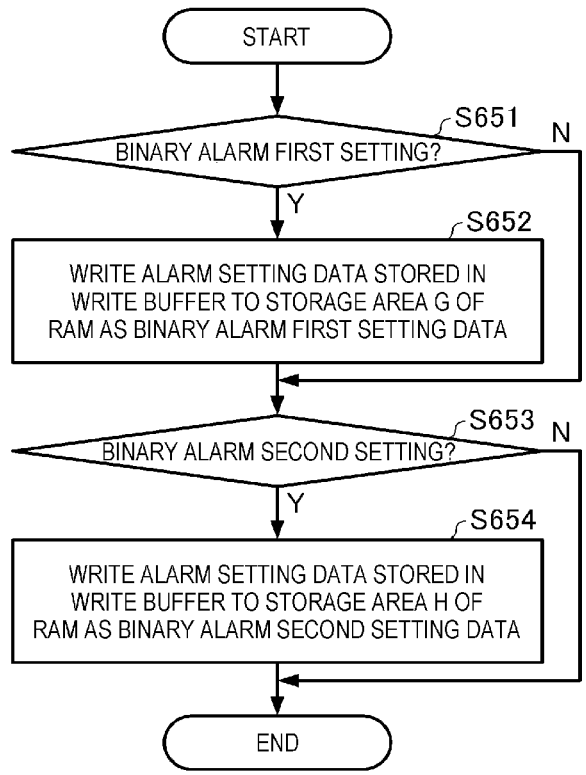
FIG. 13 is a flowchart showing an example of a procedure of a binary alarm setting process in step S65 in FIG. 11.

FIG. 13 is a flowchart showing an example of the procedure of the binary alarm setting process in step S65 in FIG. 11.

As shown in FIG. 13, in step S651, when the request from the host device 6 is a binary alarm first setting, in step S652, the processor 60 writes, as the binary alarm first setting data A1_BIN, the alarm setting data stored in the write buffer 70 to the storage area G of the RAM 101.

Next, in step S653, when the request from the host device 6 is the binary alarm second setting, in step S654, the processor 60 writes, as the binary alarm second setting data A2_BIN, the alarm setting data stored in the write buffer 70 to the storage area H of the RAM 101.

Figure 14:
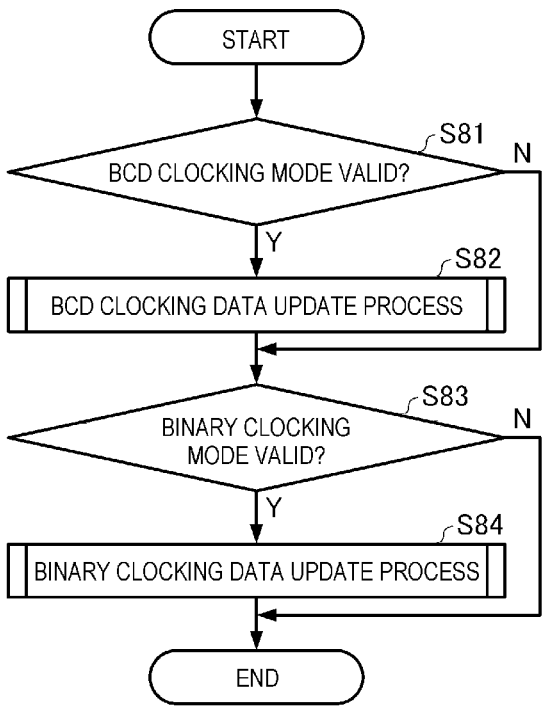
FIG. 14 is a flowchart showing an example of a procedure of a time point update process in step S8 in FIG. 6.

FIG. 14 is a flowchart showing an example of the procedure of the time point update process in step S8 in FIG. 6.

As shown in FIG. 14, first, in step S81, when the BCD clocking mode is valid, in step S82, the real-time clock module 1 performs a BCD clocking data update process of updating the BCD clocking data T_BCD stored in the RAM 101. When the BCD clocking mode is invalid in step S81, the real-time clock module 1 does not perform the BCD clocking data update process in step S82. Details of a procedure of the BCD clocking data update process will be described later.

Next, in step S83, when the binary clocking mode is valid, in step S84, the real-time clock module 1 performs a binary clocking data update process of updating the binary clocking data T_BIN stored in the RAM 101. When the binary clocking mode is invalid in step S83, the real-time clock module 1 does not perform the binary clocking data update process in step S84. Details of a procedure of the binary clocking data update process will be described later.

Figure 15:
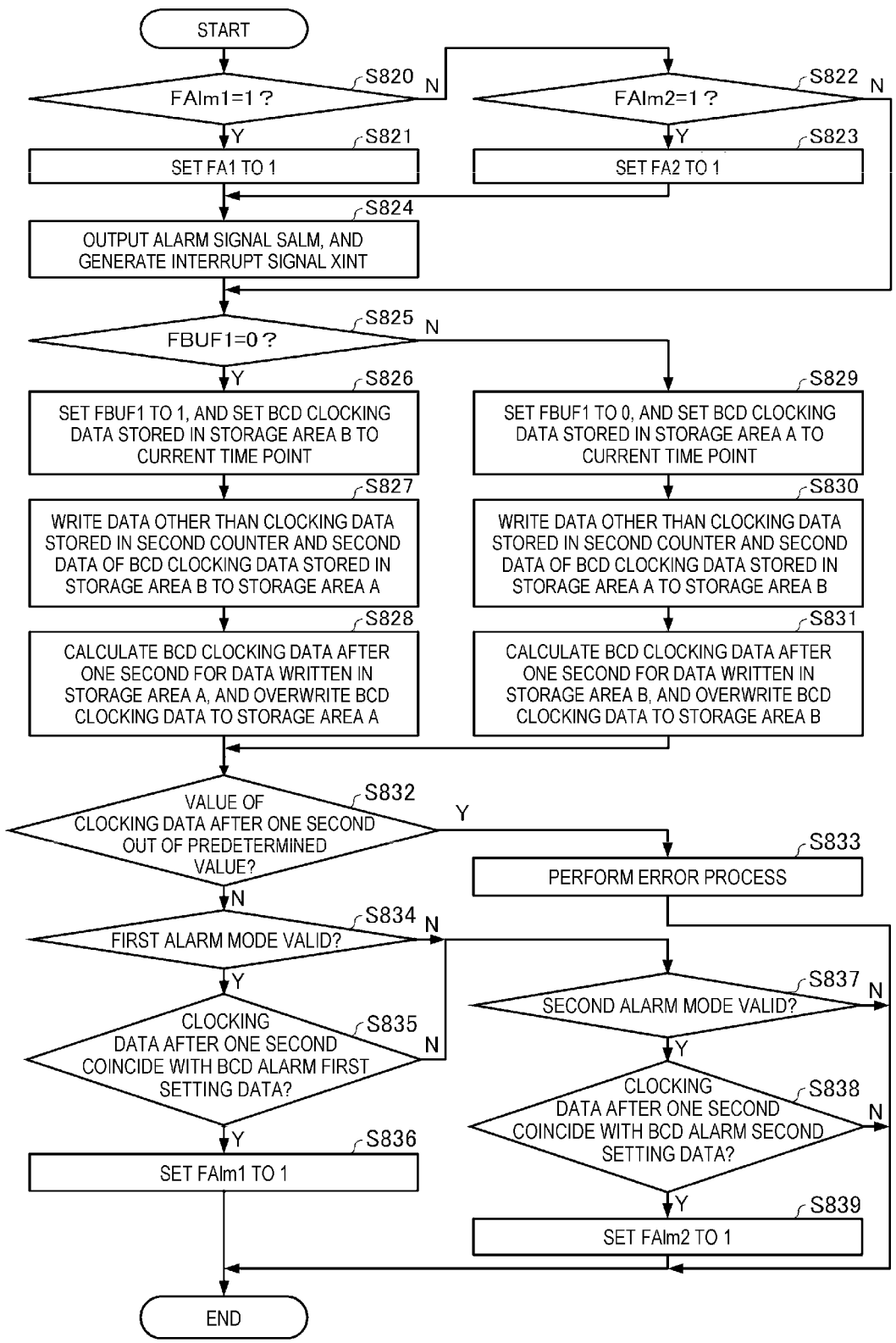
FIG. 15 is a flowchart showing an example of a procedure of a BCD time point update process in step S82 in FIG. 14.

FIG. 15 is a flowchart showing an example of the procedure of the BCD time point update process in step S82 in FIG. 14.

As shown in FIG. 15, first, in step S820, when the first pre-alarm flag FAlm1 is 1, the processor 60 sets the first alarm flag FA1 to 1 in step S821.

When the first pre-alarm flag FAlm1 is 0 in step S820, if the second pre-alarm flag FAlm2 is 1 in step S822, the processor 60 sets the second alarm flag FA2 to 1 in step S823.

Next, in step S824, the processor 60 outputs the alarm signal SALM, and the interrupt generation circuit 120 generates the interrupt signal XINT.

When the first pre-alarm flag FAlm1 is 0 in step S820 and the second pre-alarm flag FAlm2 is 0 in step S822, the processor 60 and the interrupt generation circuit 120 do not perform the process in step S824.

Next, when the first current time point selection flag FBUF1 is 0 in step S825, in step S826, the processor 60 sets the first current time point selection flag FBUF1 to 1 and sets the BCD clocking data T_BCD stored in the storage area B of the RAM 101 to the current time point.

Next, in step S827, the processor 60 writes data other than the clocking data SEC_BCD stored in the second counter 40 and the second data of the BCD clocking data T_BCD stored in the storage area B of the RAM 101 to the storage area A of the RAM 101.

Next, in step S828, the processor 60 calculates the BCD clocking data T_BCD after one second for the data written in the storage area A in step S827, and overwrites the BCD clocking data T_BCD to the storage area A.

When the first current time point selection flag FBUF1 is 1 in step S825, in step S829, the processor 60 sets the first current time point selection flag FBUF1 to 0 and sets the BCD clocking data T_BCD stored in the storage area A of the RAM 101 to the current time point.

Next, in step S830, the processor 60 writes data other than the clocking data SEC_BCD stored in the second counter 40 and the second data of the BCD clocking data T_BCD stored in the storage area A of the RAM 101 to the storage area B of the RAM 101.

Next, in step S831, the processor 60 calculates the BCD clocking data T_BCD after one second for the data written in the storage area B in step S830, and overwrites the BCD clocking data T_BCD to the storage area B.

Next, in step S832, the processor 60 determines whether the value of the BCD clocking data T_BCD after one second calculated in step S828 or step S831 is out of a predetermined range. Then, when the value of the BCD clocking data T_BCD after one second is out of the predetermined range in step S832, the processor 60 performs the error process in step S833. For example, the processor 60 performs, as the error process, at least one of the process of outputting the error signal SERR, the process of stopping the update of the BCD clocking data T_BCD, and the process of initializing the BCD clocking data T_BCD to a value included in the predetermined range. The processor 60 sets the first error flag FE1 to 1, and the interrupt generation circuit 120 generates the interrupt signal XINT based on the error signal SERR.

When the value of the BCD clocking data T_BCD after one second is within the predetermined range in step S832, if the first alarm mode is valid in step S834, the processor 60 determines whether the BCD clocking data T_BCD after one second coincides with the BCD alarm first setting data A1_BCD in step S835. Then, when the BCD clocking data T_BCD after one second coincides with the BCD alarm first setting data A1_BCD in step S835, the processor 60 sets the first pre-alarm flag FAlm1 to 1 in step S836.

When the first alarm mode is invalid in step S834, or when the BCD clocking data T_BCD after one second does not coincide with the BCD alarm first setting data A1_BCD in step S835, if the second alarm mode is valid in step S837, the processor 60 determines whether the BCD clocking data T_BCD after one second coincides with the BCD alarm second setting data A2_BCD in step S838. Then, when the BCD clocking data T_BCD after one second coincides with the BCD alarm second setting data A2_BCD in step S838, the processor 60 sets the second pre-alarm flag FAlm2 to 1 in step S839.

Figure 16:
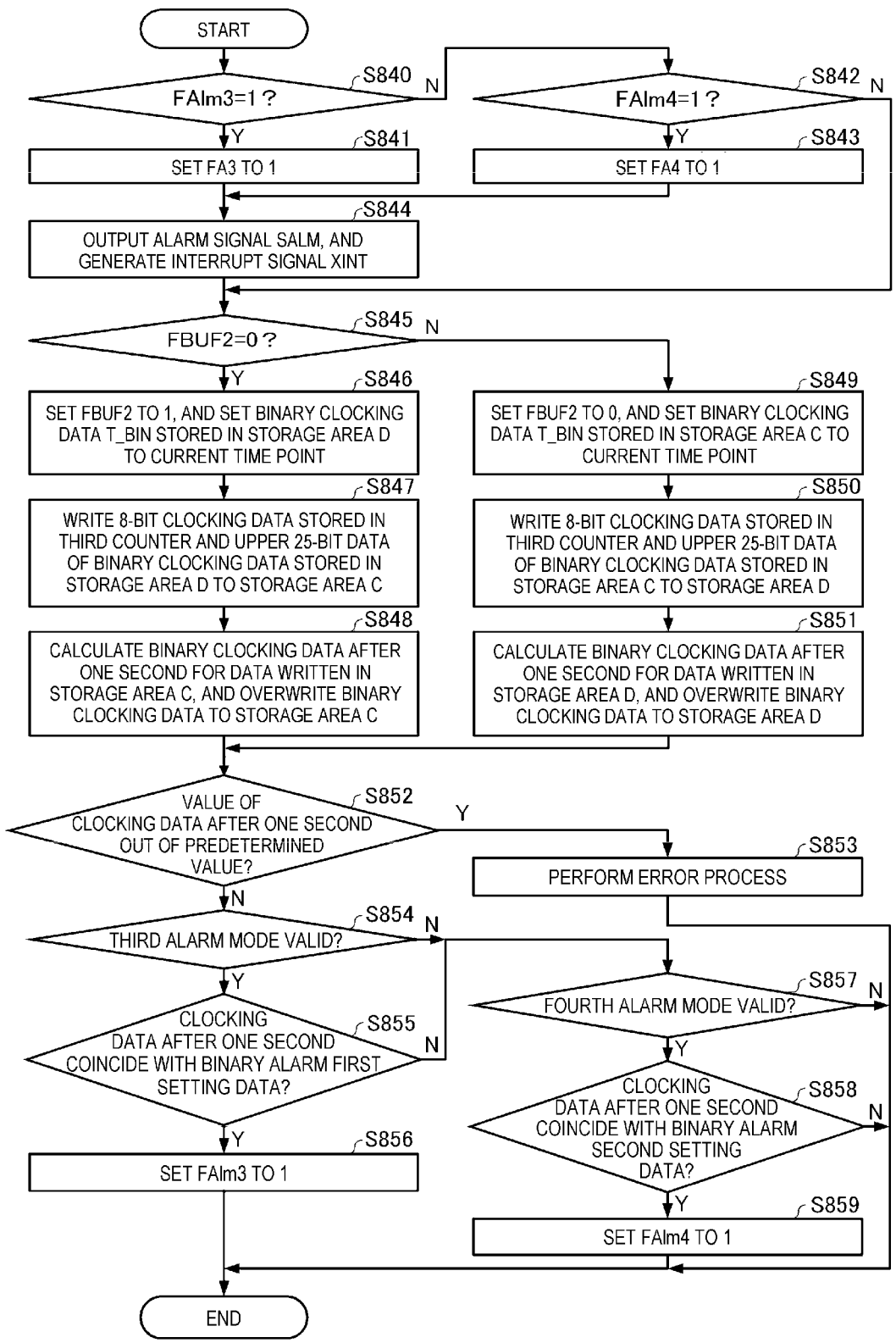
FIG. 16 is a flowchart showing an example of a procedure of a binary time point update process in step S84 in FIG. 14.

FIG. 16 is a flowchart showing an example of the procedure of the binary time point update process in step S84 in FIG. 14.

As shown in FIG. 16, first, in step S840, when the third pre-alarm flag FAlm3 is 1, the processor 60 sets the third alarm flag FA3 to 1 in step S841.

When the third pre-alarm flag FAlm3 is 0 in step S840, if the fourth pre-alarm flag FAlm4 is 1 in step S842, the processor 60 sets the fourth alarm flag FA4 to 1 in step S843.

Next, in step S844, the processor 60 outputs the alarm signal SALM, and the interrupt generation circuit 120 generates the interrupt signal XINT.

When the third pre-alarm flag FAlm3 is 0 in step S840 and the fourth pre-alarm flag FAlm4 is 0 in step S842, the processor 60 and the interrupt generation circuit 120 do not perform the process in step S844.

Next, when the second current time point selection flag FBUF2 is 0 in step S845, in step S846, the processor 60 sets the second current time point selection flag FBUF2 to 1 and sets the binary clocking data T_BIN stored in the storage area D of the RAM 101 to the current time point.

Next, in step S847, the processor 60 writes the 8-bit clocking data SEC_BIN stored in the third counter 50 and the upper 25-bit data of the binary clocking data T_BIN stored in the storage area D of the RAM 101 to the storage area C of the RAM 101.

Next, in step S848, the processor 60 calculates the binary clocking data T_BIN after one second for the data written in the storage area C in step S847, and overwrites the binary clocking data T_BIN to the storage area C.

When the second current time point selection flag FBUF2 is 1 in step S845, in step S849, the processor 60 sets the second current time point selection flag FBUF2 to 0 and sets the binary clocking data T_BIN stored in the storage area C of the RAM 101 to the current time point.

Next, in step S850, the processor 60 writes the 8-bit clocking data SEC BIN stored in the third counter 50 and the upper 25-bit data of the binary clocking data T_BIN stored in the storage area C of the RAM 101 to the storage area D of the RAM 101.

Next, in step S851, the processor 60 calculates the binary clocking data T_BIN after one second for the data written in the storage area D in step S850, and overwrites the binary clocking data T_BIN to the storage area D.

Next, in step S852, the processor 60 determines whether a value of the binary clocking data T_BIN after one second calculated in step S848 or step S851 is out of a predetermined range. Then, when the value of the binary clocking data T_BIN after one second is out of the predetermined range in step S852, the processor 60 performs the error process in step S853. For example, the processor 60 performs, as the error process, at least one of the process of outputting the error signal SERR, the process of stopping the update of the binary clocking data T_BIN, and the process of initializing the binary clocking data T_BIN to a value included in the predetermined range. The processor 60 sets the second error flag FE2 to 1, and the interrupt generation circuit 120 generates the interrupt signal XINT based on the error signal SERR.

When the value of the binary clocking data T_BIN after one second is within the predetermined range in step S852, if the third alarm mode is valid in step S854, the processor 60 determines whether the binary clocking data T_BIN after one second coincides with the binary alarm first setting data A1_BIN in step S855. Then, when the binary clocking data T_BIN after one second coincides with the binary alarm first setting data A1_BIN in step S855, the processor 60 sets the third pre-alarm flag FAlm3 to 1 in step S856.

When the third alarm mode is invalid in step S854, or when the binary clocking data T_BIN after one second does not coincide with the binary alarm first setting data A1_BIN in step S855, if the fourth alarm mode is valid in step S857, the processor 60 determines whether the binary clocking data T_BIN after one second coincides with the binary alarm second setting data A2_BIN in step S858. Then, when the binary clocking data T_BIN after one second coincides with the binary alarm second setting data A2_BIN in step S858, the processor 60 sets the fourth pre-alarm flag FAlm4 to 1 in step S859.

1-3. Sequence Example of Process Executed by Processor

Figure 17:
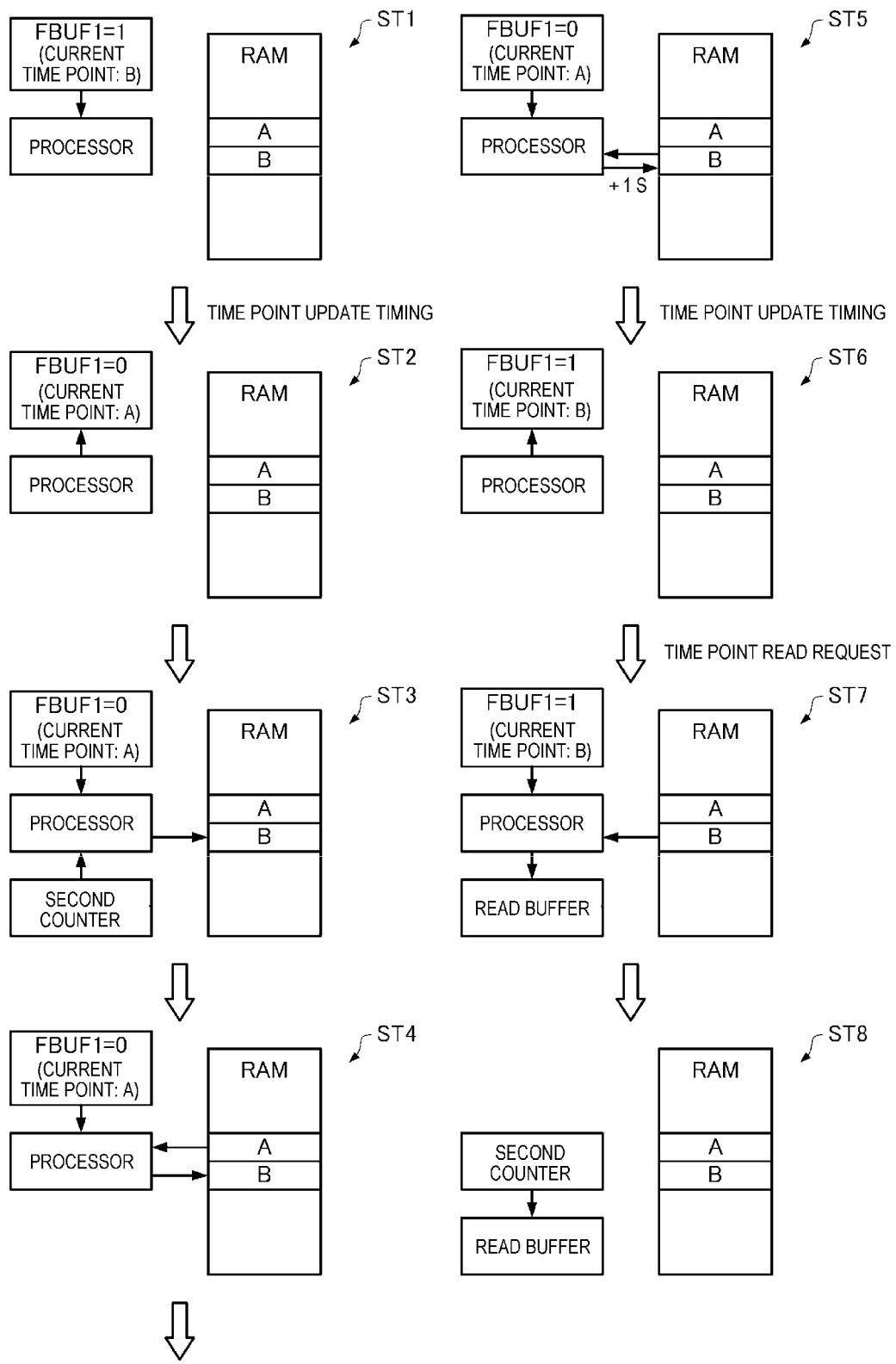
FIG. 17 is a diagram showing an example of a sequence of a clocking process executed by a processor.

FIG. 17 is a diagram showing an example of a sequence of the clocking process executed by the processor 60.

In the example in FIG. 17, first, as shown in ST1, the first current time point selection flag FBUF1 is 1, and the BCD clocking data T_BCD stored in the storage area B of the RAM 101 represents the current time point.

When the next time point update timing arrives, as shown in ST2, the processor 60 sets the first current time point selection flag FBUF1 to 0. Accordingly, the BCD clocking data T_BCD stored in the storage area A of the RAM 101 represents the current time point.

Next, as shown in ST3, since the first current time point selection flag FBUF1 is 0, the processor 60 writes, as the second data, the clocking data SEC BCD stored by the second counter 40 to the storage area B of the RAM 101.

Next, as shown in ST4, since the first current time point selection flag FBUF1 is 0, the processor 60 reads the BCD clocking data T_BCD corresponding to the current time point stored in the storage area A, and writes data other than the second data included in the BCD clocking data T_BCD to the storage area B of the RAM 101.

Next, as shown in ST5, since the first current time point selection flag FBUF1 is 0, the processor 60 reads the data written in the storage area B, calculates the BCD clocking data T_BCD after one second, and overwrites the BCD clocking data T_BCD to the storage area B.

When the next time point update timing arrives, as shown in ST6, the processor 60 sets the first current time point selection flag FBUF1 to 1. Accordingly, the BCD clocking data T_BCD stored in the storage area B of the RAM 101 represents the current time point.

Next, as shown in ST7, when a time point read request is issued, since the first current time point selection flag FBUF1 is 1, the processor 60 reads the BCD clocking data T_BCD corresponding to the current time point stored in the storage area B, and transfers data other than the second data included in the BCD clocking data T_BCD to the read buffer 80.

Next, as shown in ST8, the second counter 40 transfers the clocking data SEC_BCD to the read buffer 80. Then, the clocking data synthesized by the read buffer 80 is sent to the host device 6 via the interface circuit 90.

Figure 18:
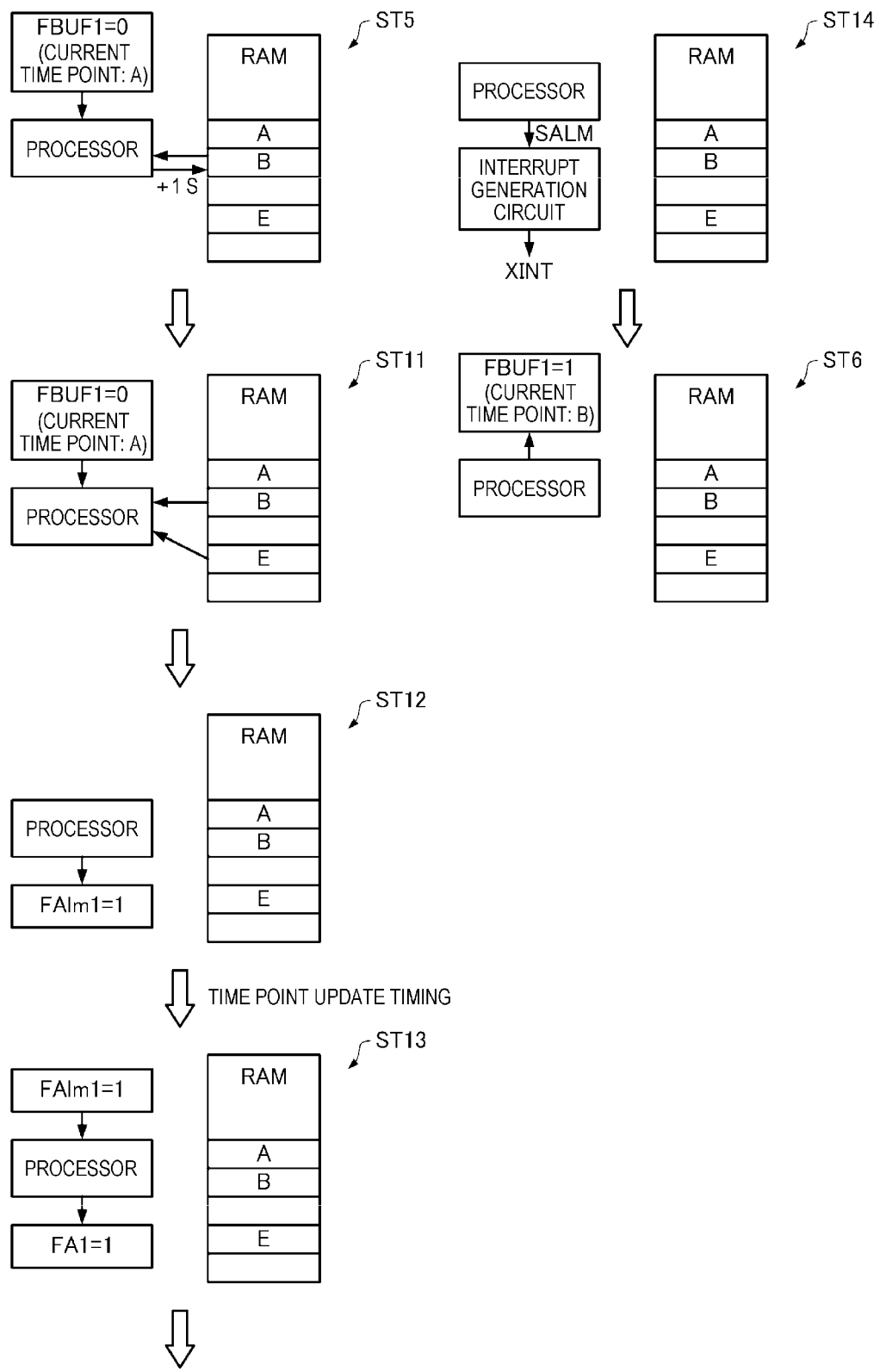
FIG. 18 is a diagram showing an example of a sequence of an alarm process executed by the processor.

FIG. 18 is a diagram showing an example of a sequence of the alarm process executed by the processor 60. In the example of FIG. 18, the alarm process is performed between ST5 and ST6 in FIG. 17.

In the example of FIG. 18, first, as shown in ST5, since the first current time point selection flag FBUF1 is 0, the processor 60 reads the data written in the storage area B of the RAM 101, calculates the BCD clocking data T_BCD after one second, and overwrites the BCD clocking data T_BCD to the storage area B.

Next, as shown in ST11, since the first current time point selection flag FBUF1 is 0, the processor 60 reads the BCD clocking data T_BCD stored in the storage area B and the BCD alarm first setting data A1_BCD stored in the storage area E of the RAM 101.

Next, as shown in ST12, when the read BCD clocking data T_BCD coincides with the BCD alarm first setting data A1_BCD, the processor 60 sets the first pre-alarm flag FAlm1 to 1.

As shown in ST13, when the next time point update timing arrives, since the first pre-alarm flag FAlm1 is 1, the processor 60 sets the first alarm flag FA1 to 1.

Next, as shown in ST14, the processor 60 outputs the alarm signal SALM to the interrupt generation circuit 120, and the interrupt generation circuit 120 outputs the interrupt signal XINT to the host device 6.

Next, as shown in ST6, the processor 60 sets the first current time point selection flag FBUF1 to 1. Accordingly, the BCD clocking data T_BCD stored in the storage area B of the RAM 101 represents the current time point.

1-4. Functions and Effects

As described above, in the real-time clock module 1 according to the embodiment, in the real-time clock circuit 3, the processor 60 performs the alarm process by executing the program PGX transferred from the nonvolatile memory 102 and stored in the RAM 101. Therefore, the content of the alarm process can be easily changed by changing the program PG stored in the nonvolatile memory 102. In the real-time clock module 1 according to the embodiment, the processor 60 performs the alarm process based on the alarm setting data 210 that is received from the outside via the interface circuit 90 and stored in the RAM 101. Therefore, the content of the alarm process can be easily changed by changing the content of the alarm setting data 210. Therefore, according to the real-time clock module 1 in the embodiment, since various alarm functions can be implemented by a software process, the extensibility of the alarm functions can be enhanced without greatly increasing the circuit scale.

In the real-time clock module 1 according to the embodiment, in the real-time clock circuit 3, the processor 60 can execute the program PGX to select and perform the alarm process for the BCD-format time points or the alarm process for the binary-format time points. Therefore, according to the real-time clock module 1 in the embodiment, since the alarm functions for two time points in different formats can be implemented by the software process, the extensibility of the alarm functions can be enhanced without greatly increasing the circuit scale.

In the real-time clock module 1 according to the embodiment, in the real-time clock circuit 3, the processor 60 can execute the program PGX to perform a two-channel alarm process for the BCD-format time points and a two-channel alarm process for the binary-format time points. Therefore, according to the real-time clock module 1 in the embodiment, since the alarm functions of four channels can be implemented by the software process, the extensibility of the alarm functions can be enhanced without greatly increasing the circuit scale.

According to the real-time clock module 1 in the embodiment, the clocking data 200 and the alarm setting data 210 are compressed and stored in the RAM 101. Therefore, a great increase in the size of the RAM 101 is prevented in order to enhance the extensibility. According to the real-time clock module 1 in the embodiment, since the BCD clocking data T_BCD and the setting data A1_BCD and A2_BCD of the BCD alarm setting data 211 are in the same compressed format, the processor 60 can easily perform the comparison process between the BCD clocking data T_BCD and the setting data A1_BCD and A2_BCD.

In the real-time clock module 1 according to the embodiment, in the real-time clock circuit 3, the processor 60 executes the program PGX to perform the clocking process in the BCD format or the binary format by a double buffer method using the two storage areas A and B or the two storage areas C and D of the RAM 101. Therefore, according to the real-time clock module 1 in the embodiment, since a clocking function can be implemented by the software process, the extensibility of the clocking function can be enhanced without greatly increasing the circuit scale. In particular, according to the real-time clock module 1 in the embodiment, since a clocking circuit in the BCD format or the binary format as hardware is not necessary, it is possible to reduce the size of the real-time clock circuit 3. Further, in the real-time clock module 1 according to the embodiment, it is possible to easily handle an exception of a leap year that occurs once every 400 years in the clocking process executed by the processor 60 by the software process. Therefore, according to the real-time clock module 1 in the embodiment, it is not necessary to provide a circuit that operates only very rarely as hardware, and it is possible to further reduce the size of the real-time clock circuit 3.

According to the real-time clock module 1 in the embodiment, the processor 60 generates the clocking data 200 corresponding to the next time point before the next time point update timing arrives, and compares the clocking data 200 corresponding to the next time point with the alarm setting data 210. Therefore, the alarm signal SALM can be output immediately when the next time point update timing arrives.

According to the real-time clock module 1 in the embodiment, since the error process is performed when the value of the clocking data 200 is out of the predetermined range, it is possible to prevent an erroneous clocking process from being continued.

2. Modification

In the above embodiment, the clocking data 200 stored in the RAM 101 includes two pieces of data, that is, the BCD clocking data T_BCD and the binary clocking data T_BIN. The number of pieces of data included in the clocking data 200 is not limited to two, and may be one, or three or more.

In the above embodiment, the alarm setting data 210 stored in the RAM 101 includes four pieces of setting data, that is, the BCD alarm first setting data A1_BCD, the BCD alarm second setting data A2_BCD, the binary alarm first setting data A1_BIN, and the binary alarm second setting data A2_BIN, which are four pieces of setting data. The number of pieces of setting data included in the alarm setting data 210 is not limited to four, and may be one, two, three, or five or more.

In the above embodiment, the various flags are stored by the register, and may be stored in the RAM 101.

In the above embodiment, the processor 60 performs the error process when the value of the clocking data 200 is out of the predetermined range. The same error process may be performed when the value of the alarm setting data 210 is not included in the predetermined range corresponding to the range of time points at which the value of the alarm setting data 210 can exist. The processor 60 may also perform the error process when the time point data stored in the write buffer 70 is out of the predetermined range before writing the clocking data 200 and the alarm setting data 210 to the RAM 101.

In the above embodiment, the real-time clock circuit 3 includes the second counter 40 and the third counter 50, and may not include at least one of the second counter 40 and the third counter 50. When the second counter 40 does not exist, if the BCD clocking mode is valid, the processor 60 may add 1 to the BCD clocking data T_BCD corresponding to the current time point stored in one of the storage area A and the storage area B of the RAM 101 every second, generate the BCD clocking data T_BCD corresponding to the time point after one second, and store the BCD clocking data T_BCD to the other of the storage area A and the storage area B. When the third counter 50 does not exist, if the binary clocking mode is valid, the processor 60 may add 1 to the binary clocking data T_BIN corresponding to the current time point stored in one of the storage area C and the storage area D of the RAM 101 every second, generate the binary clocking data T_BIN corresponding to the time point after one second, and store the binary clocking data T_BIN to the other of the storage area C and the storage area D.

In the above embodiment, the processor 60 generates the clocking data 200 by executing the program PGX, but instead, the real-time clock circuit 3 may include a clocking circuit as hardware that generates a part or all of the clocking data 200. In this case, the processor 60 may execute the program PGX to acquire the clocking data corresponding to the current time point from the clocking circuit, calculate the clocking data after one second, store the clocking data after one second to the RAM 101, and perform the alarm process by software.

The present disclosure is not limited to the embodiment, and various modifications can be made within the scope of the gist of the present disclosure.

The embodiment and the modification described above are merely examples, and the present disclosure is not limited thereto. For example, the embodiment and the modification can be combined as appropriate.

The present disclosure includes a configuration substantially the same as the configurations described in the embodiments (for example, a configuration having the same functions, methods, and results, or a configuration having the same objects and effects). The present disclosure includes a configuration obtained by replacing a non-essential portion of the configuration described in the embodiment. The present disclosure includes a configuration having the same function and effect as the configuration described in the embodiment, or a configuration capable of achieving the same purpose. The present disclosure includes a configuration in which a known technique is added to the configuration described in the embodiment.

The following contents are derived from the above embodiment and the modification.

A real-time clock module according to one aspect includes: an oscillation circuit configured to generate a first clock signal by oscillating a resonator; an interface circuit configured to receive alarm setting data; a memory in which the alarm setting data and a program are to be stored; and a processor configured to execute the program to perform a comparison process of comparing clocking data generated based on the first clock signal with the alarm setting data, and output an alarm signal according to a result of the comparison process.

In the real-time clock module, the processor executes the program to compare the clocking data with the alarm setting data, so that a content of the comparison process can be easily changed by changing the program. In the real-time clock module, the processor performs the comparison process based on the alarm setting data received from outside via the interface circuit, so that, the content of the comparison process can be easily changed by changing a content of the alarm setting data. Therefore, according to the real-time clock module, since various alarm functions can be implemented by a software process, the extensibility of the alarm functions can be enhanced without greatly increasing the circuit scale.

The real-time clock module according to the aspect may further include: a counter configured to count the number of pulses of a second clock signal based on the first clock signal, and output a third clock signal based on a count value. The processor may generate the clocking data based on the third clock signal by executing the program.

In the real-time clock module according to the aspect, the clocking data may be at least one of BCD-format clocking data and binary-format clocking data, and the alarm setting data may be at least one of BCD-format clocking data and binary-format clocking data.

In the real-time clock module, the processor can execute the program to perform a comparison process between the BCD-format clocking data and the alarm setting data and a comparison process between the binary-format clocking data and the alarm setting data. Therefore, according to the real-time clock module, since the alarm functions for two time points in different formats can be implemented by the software process, the extensibility of the alarm functions can be enhanced without greatly increasing the circuit scale.

In the real-time clock module according to the aspect, the alarm setting data may include a plurality of pieces of setting data corresponding to a plurality of time points.

In the real-time clock module, the processor can perform, by executing the program, the comparison process between each piece of setting data of the plurality of pieces of setting data included in the alarm setting data and the clocking data. Therefore, according to the real-time clock module, since the alarm functions for the plurality of time points can be implemented by the software process, the extensibility of the alarm functions can be enhanced without greatly increasing the circuit scale.

In the real-time clock module according to the aspect, the alarm setting data and the clocking data may be compressed in a same format and stored in the memory.

According to the real-time clock module, the alarm setting data and the clocking data are compressed and stored in the memory. Therefore, a great increase in the size of the memory is prevented in order to enhance the extensibility. According to the real-time clock module, since the alarm setting data and the clocking data are compressed in the same format, the processor can easily perform the comparison process between the clocking data and the alarm setting data.

In the real-time clock module according to the aspect, the clocking data may be stored in the memory, and the processor may read first clocking data, which is the clocking data corresponding to a current time point, from the memory, generate second clocking data, which is the clocking data corresponding to a next time point, based on the first clocking data, and store the second clocking data in the memory, and output the alarm signal at a next time point update timing when the second clocking data and the alarm setting data are compared and the second clocking data coincides with the alarm setting data.

According to the real-time clock module in the embodiment, since a clocking function can be implemented by the software process, the extensibility of the clocking function can be enhanced without greatly increasing the circuit scale. According to the real-time clock module, the processor generates the second clocking data corresponding to the next time point before the next time point update timing arrives, and compares the second clocking data with the alarm setting data. Therefore, the alarm signal can be output immediately when the next time point update timing arrives.

In the real-time clock module according to the aspect, the processor may perform, when a value of the clocking data is not included in a predetermined range, at least one of a process of outputting an error signal, a process of stopping update of the clocking data, and a process of initializing the clocking data to a value included in the predetermined range.

According to the real-time clock module, it is possible to prevent an erroneous clocking process from being continued.

What is claimed is:

1. A real-time clock module comprising:
an oscillation circuit configured to generate a first clock signal by oscillating a resonator;
a frequency divider circuit configured to receive the first clock signal and divide a first frequency of the first clock signal to generate a second clock signal having a second frequency;
a first counter that is a first binary counter, the first counter being configured to count a number of pulses of the second clock signal to:
  generate a third clock signal having a third frequency based on a first count value corresponding to the counted number of pulses of the second clock signal; and
  generate first clocking data representing a first time point unit, the first clocking data corresponding to the first count value;
a second counter that is a BCD counter, the second counter being configured to count a number of pulses of the third clock signal to:
  generate a BCD count value; and
  generate second clocking data representing a second time point unit, the second clocking data corresponding to the BCD count value;
a third counter that is a second binary counter, the third counter being configured to count a number of pulses of the third clock signal to:
  generate a binary count value; and
  generate third clocking data representing the second time point unit, the third clocking data corresponding to the binary count value;
an interface circuit configured to receive alarm setting data;
a memory configured to store the alarm setting data and a program; and
a processor configured to execute the program to:
  generate BCD clocking data based on the second clocking data;
  generate BIN clocking data based on the third clocking data;
  perform a comparison process of comparing at least one of the BCD clocking data or the BIN clocking data with the alarm setting data; and
  output an alarm signal according to a result of the comparison process.

2. The real-time clock module according to claim 1, wherein
the alarm setting data includes a plurality of pieces of setting data corresponding to a plurality of time point units.

3. The real-time clock module according to claim 1, wherein
the alarm setting data and one of the second clocking data and the third clocking data are compressed in a same format and stored in the memory.

4. The real-time clock module according to claim 1, wherein
the processor is further configured to:
  output the alarm signal at a next time point update timing when the second clocking data and the alarm setting data are compared and the second clocking data coincides with the alarm setting data.

5. The real-time clock module according to claim 1, wherein
the processor is further configured to:
  determine whether a first value of the second clocking data is within a first predetermined range;
  perform at least one of a process of outputting a first error signal, a process of stopping update of the second clocking data, and a process of initializing the second clocking data to a first initial value that is within the first predetermined range when the processor determines that the first value is outside of the first predetermined range;
  determine whether a second value of the third clocking data is within a second predetermined range; and
  perform at least one of a process of outputting a second error signal, a process of stopping update of the third clocking data, and a process of initializing the third clocking data to a second initial value that is within the second predetermined range when the processor determines that the second value is outside of the second predetermined range.

* * * * *